US008510941B2

(12) United States Patent
Sidhu

(10) Patent No.: US 8,510,941 B2
(45) Date of Patent: Aug. 20, 2013

(54) METHODS OF MANUFACTURING A PRINTED WIRING BOARD HAVING COPPER WRAP PLATED HOLE

(75) Inventor: Rajwant Singh Sidhu, Brea, CA (US)

(73) Assignee: DDI Global Corp., Anaheim, CA (US)

(*) Notice: Subject to any disclaimer, the term of this patent is extended or adjusted under 35 U.S.C. 154(b) by 0 days.

(21) Appl. No.: 13/399,995

(22) Filed: Feb. 17, 2012

(65) Prior Publication Data
US 2012/0144667 A1    Jun. 14, 2012

Related U.S. Application Data

(62) Division of application No. 12/157,021, filed on Jun. 5, 2008, now Pat. No. 8,156,645.

(60) Provisional application No. 60/933,541, filed on Jun. 6, 2007.

(51) Int. Cl.
H01K 3/10    (2006.01)

(52) U.S. Cl.
USPC ............. 29/852; 29/831; 29/847; 174/262; 427/97.2

(58) Field of Classification Search
USPC ............ 29/830, 831, 846, 847, 851, 852; 174/262, 264; 205/125; 216/17, 18; 427/97.2
See application file for complete search history.

(56) References Cited

U.S. PATENT DOCUMENTS

| | | | |
|---|---|---|---|
| 4,325,780 A | 4/1982 | Schulz, Sr. | |
| 4,529,477 A * | 7/1985 | Lundberg et al. | 427/97.2 |
| 5,319,159 A * | 6/1994 | Watanabe et al. | 174/262 |
| 5,545,308 A | 8/1996 | Murphy et al. | |
| 5,837,154 A | 11/1998 | Okabe et al. | |
| 6,272,745 B1 | 8/2001 | Kersten et al. | |
| 2002/0027129 A1 | 3/2002 | Heerman | |
| 2005/0030264 A1 | 2/2005 | Tsuge et al. | |
| 2006/0240641 A1 | 10/2006 | Lauffer et al. | |
| 2007/0074902 A1 | 4/2007 | Hirata et al. | |

FOREIGN PATENT DOCUMENTS

EP    1 662 850 A1    5/2006

OTHER PUBLICATIONS

Supplementary European Search Report and Written Opinion for Application No. EP 08 76 8194, dated Jul. 9, 2010, 6 pages.
EPO Communication Under Rule 71(3) EPC indicating Examining Division intends to grant corresponding EP Application No. 08768194.6-1227, dated Jun. 22, 2011, 4 pages.
International Search Report of PCT/US08/07118 dated Aug. 29, 2008.

* cited by examiner

*Primary Examiner* — Donghai D Nguyen
(74) *Attorney, Agent, or Firm* — Polsinelli PC

(57) ABSTRACT

Printed circuit boards have circuit layers with one or more via filled holes with copper wraps and methods of manufacturing the same. An embodiment of the present invention provides a method to enhance the consistency of the wraparound plating of through-hole vias of printed circuit boards with (requiring) via filling to provide extra reliability to the printed circuit boards and enables the designers and/or manufacturers of printed circuit boards to design and manufacture boards with relatively fine features and/or tight geometries.

21 Claims, 19 Drawing Sheets
(8 of 19 Drawing Sheet(s) Filed in Color)

PRIOR ART
FIG. 1A
PRIOR ART
FIG. 2A
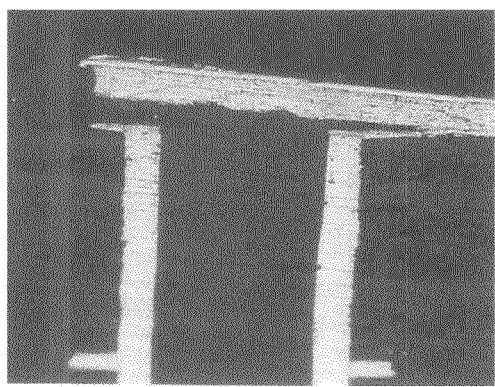
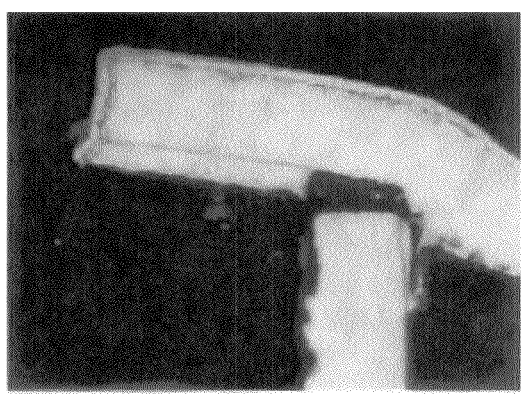
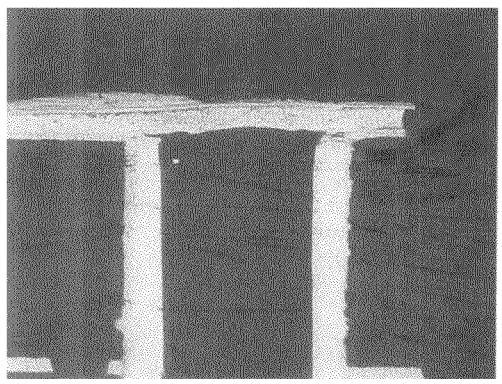
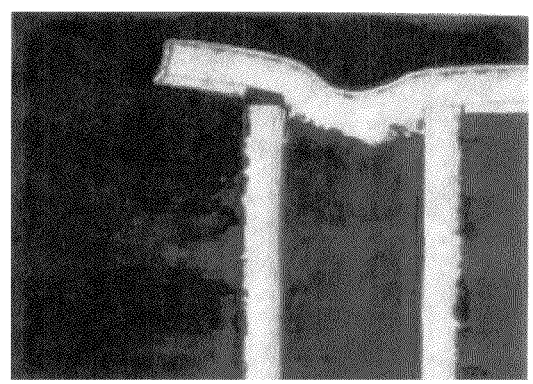
FIG. 1B
FIG. 2B
PRIOR ART
PRIOR ART

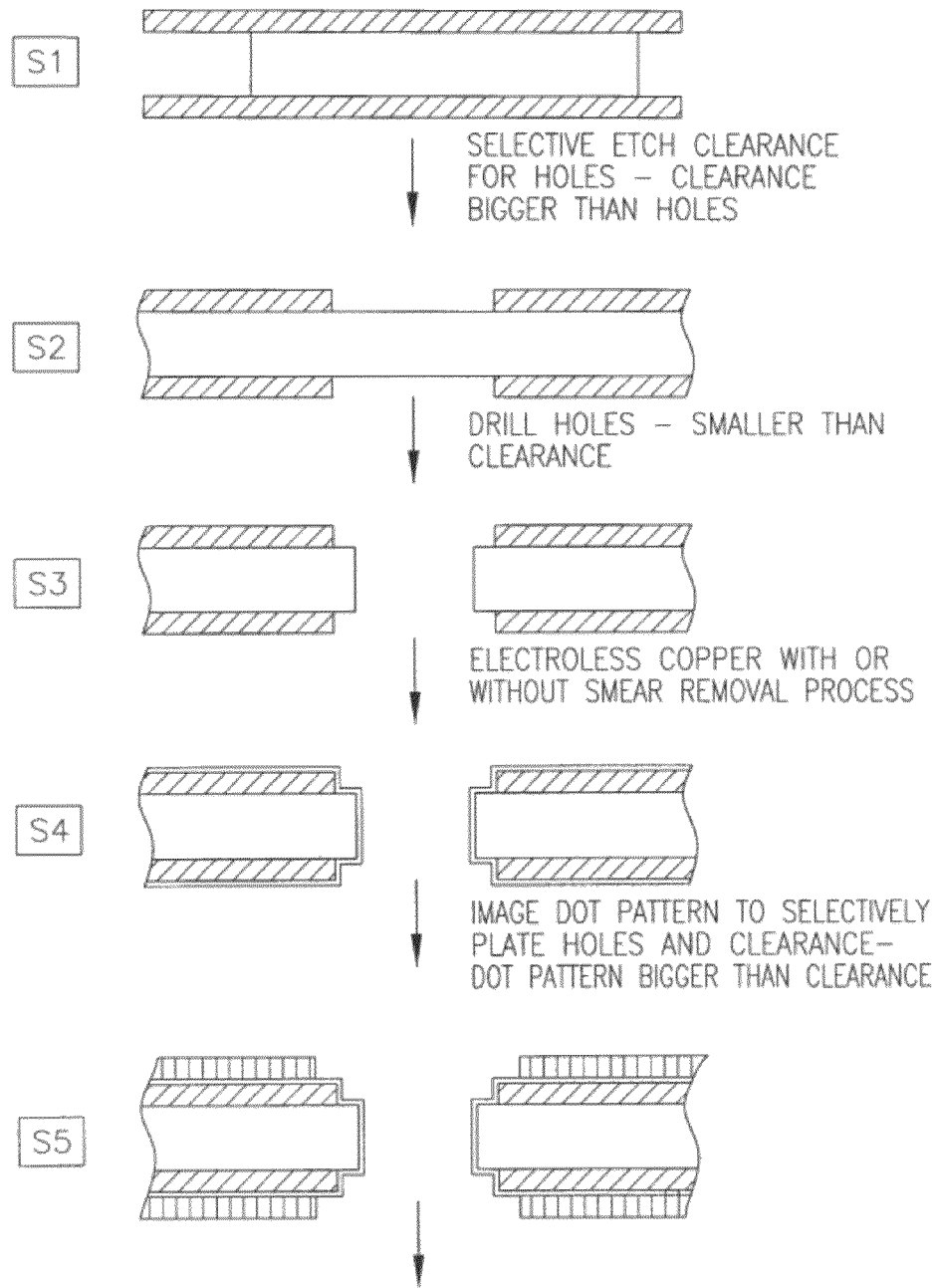

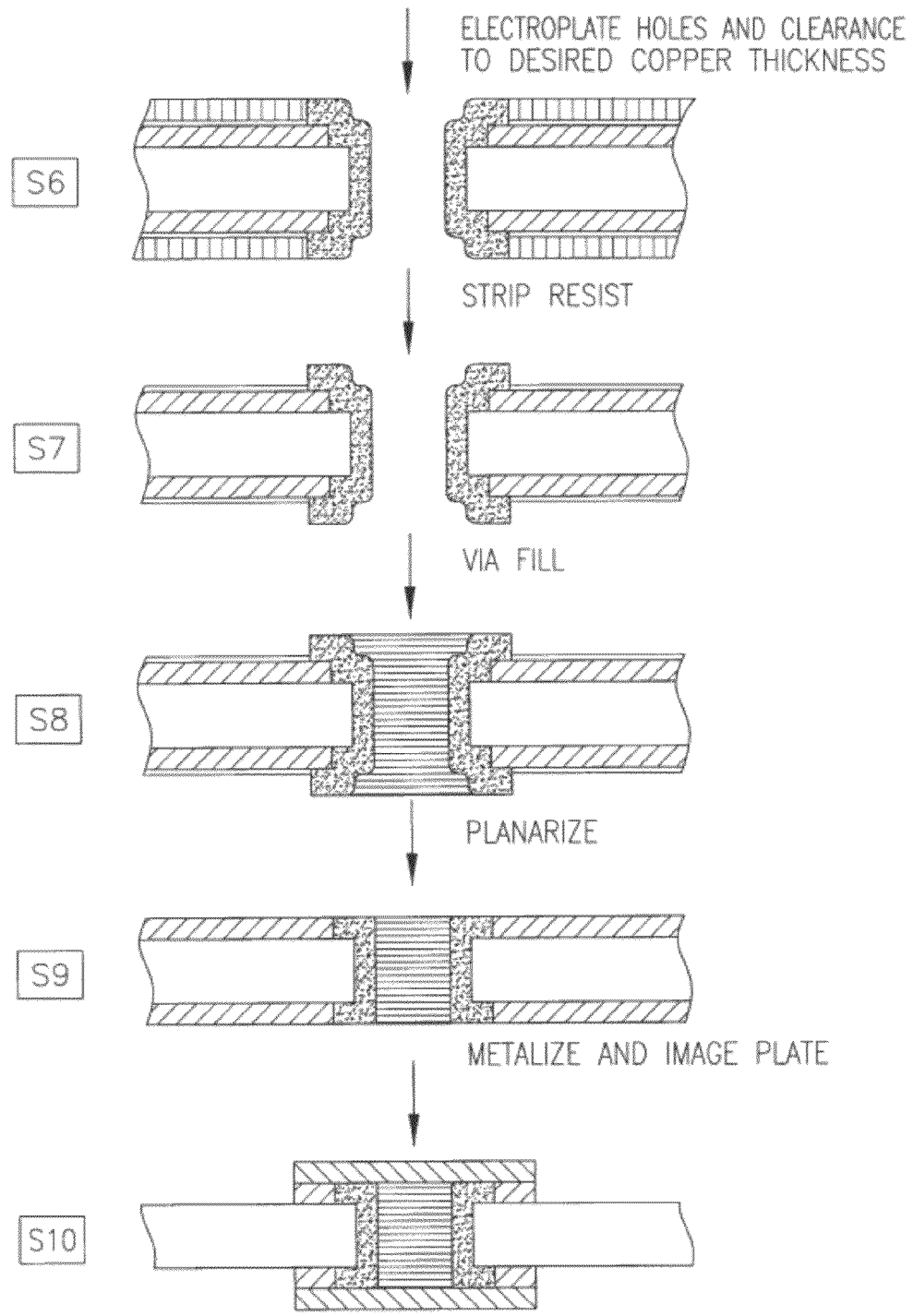

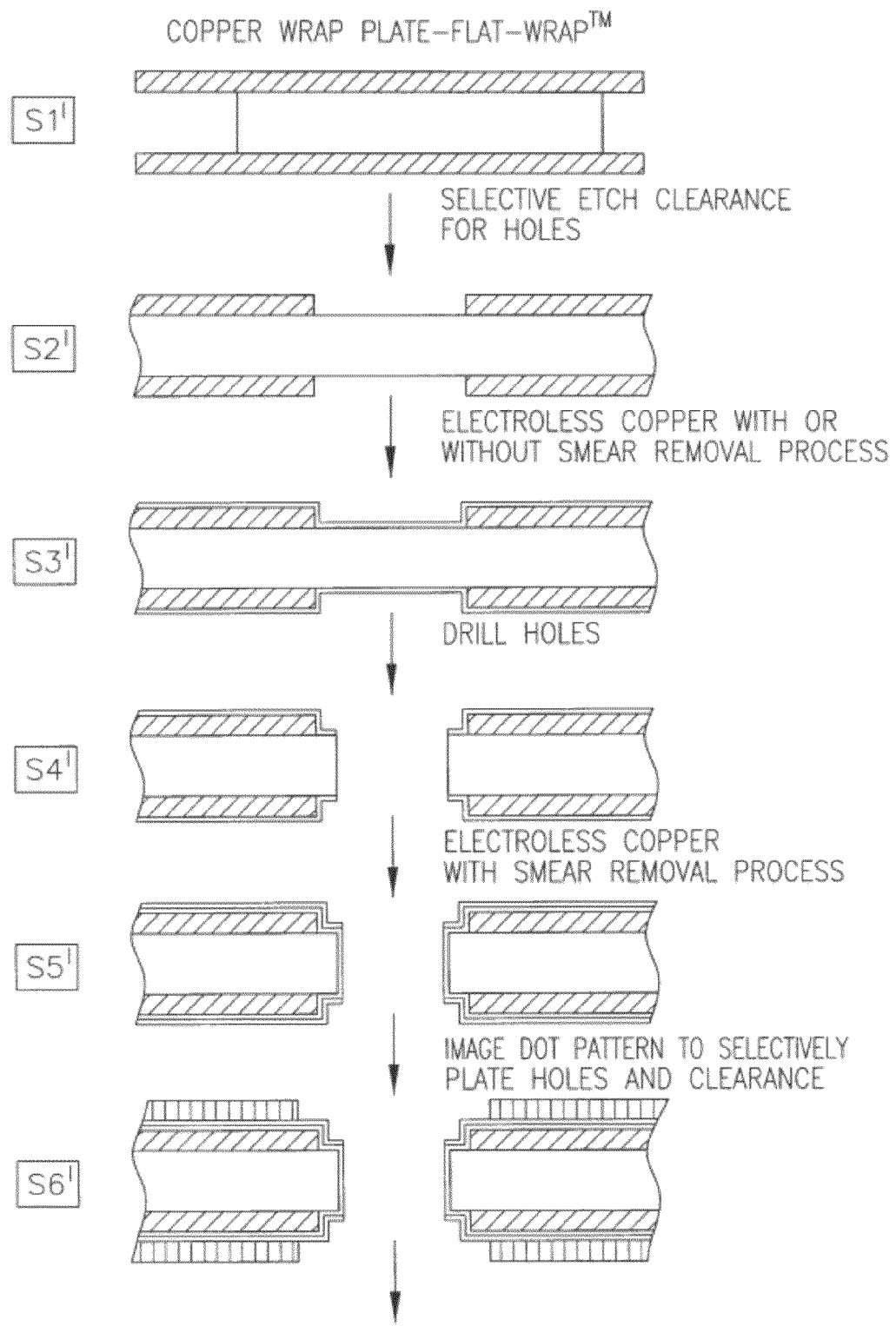

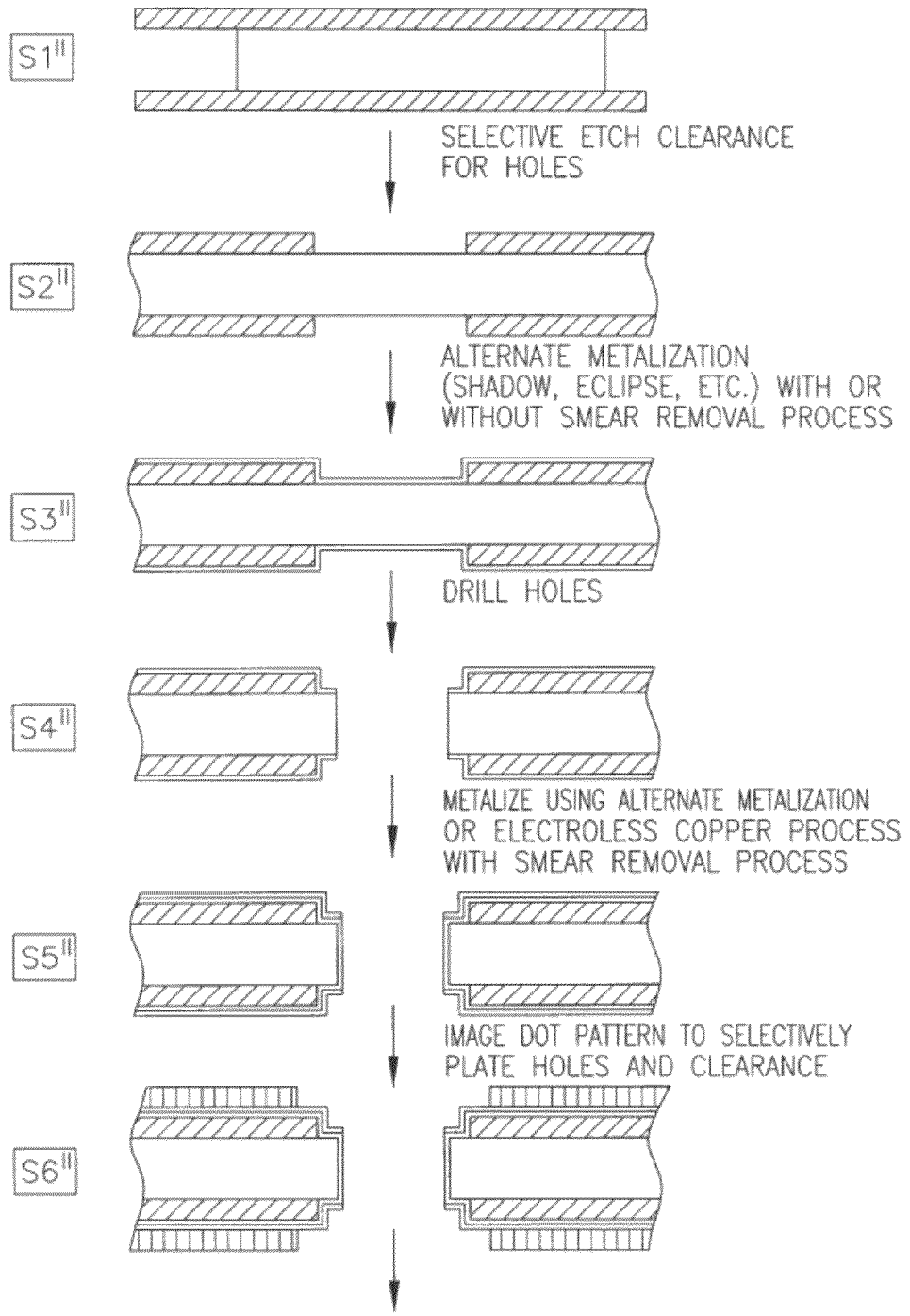

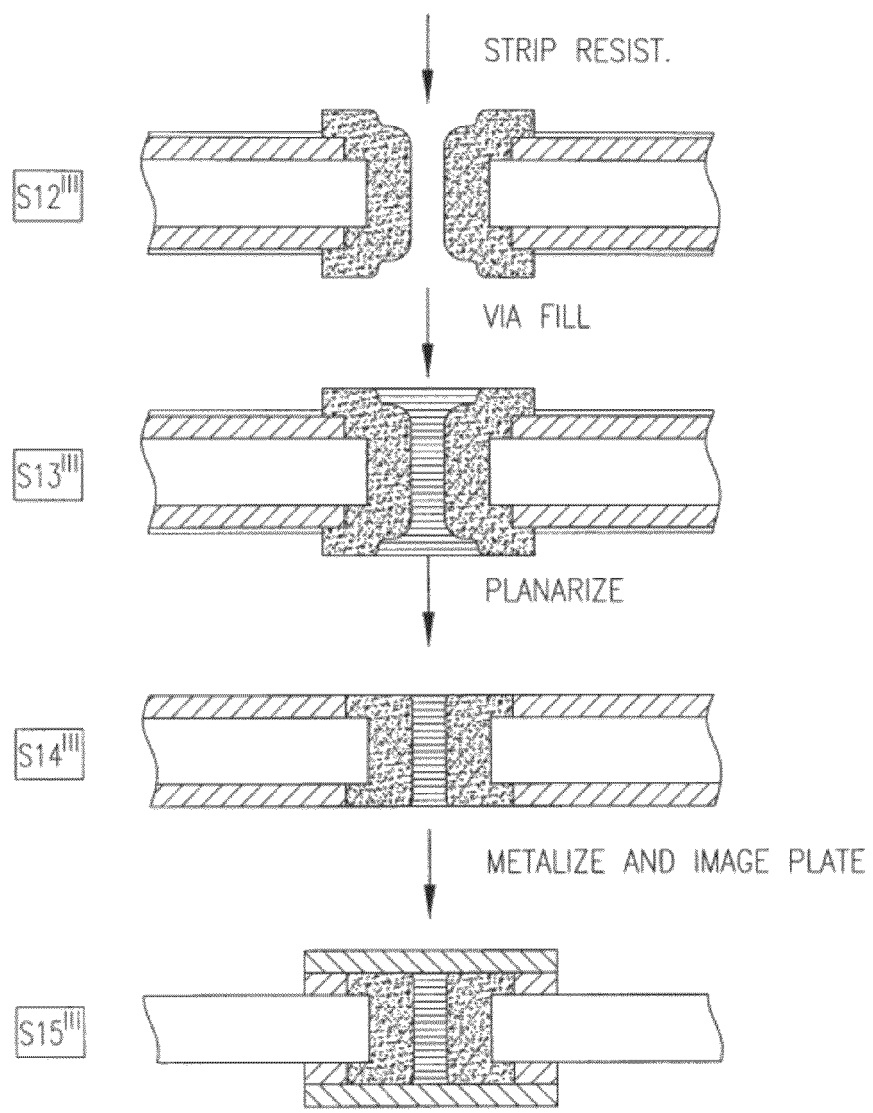

METHODS OF MANUFACTURING A PRINTED WIRING BOARD HAVING COPPER WRAP PLATED HOLE

This application is a divisional of U.S. patent application Ser. No. 12/157,021 filed Jun. 5, 2008, now U.S. Pat. No. 8,156,654, which claims priority to and the benefit of U.S. Provisional Patent Application No. 60/933,541, filed Jun. 6, 2007, the entire contents of both of which are incorporated herein by reference.

BACKGROUND OF THE INVENTION

1. Field of the Invention

The present invention relates to multilayer printed wiring boards with holes requiring copper wrap plates and methods of manufacturing the same.

2. Description of the Related Art

Most electronic systems include printed wiring (or circuit) boards with high density electronic interconnections. A printed circuit board may include one or more circuit cores, substrates, or carriers. In one fabrication scheme for the printed circuit board having the one or more circuit carriers, electronic circuitries (e.g., pads, electronic interconnects, patterns, etc.) are fabricated onto opposite sides of an individual circuit carrier to form a pair of circuit layers. These circuit layer pairs of the circuit board may then be physically and electronically joined to form the printed circuit board by fabricating an adhesive (or a prepreg or a bond ply), stacking the circuit layer pairs and the adhesives in a press, curing the resulting circuit board structure, mechanically drilling (or laser drilling) through-holes, and then plating the through-holes with a copper material to interconnect the circuit layer pairs.

In some designs requiring high reliability, these printed circuit boards are formed by filling the through-holes with a conductive ink (e.g., CB100, manufactured by DuPont, Inc., or equivalent substitute from different supplier) or a non-conductive ink (e.g., PHP-900, manufactured by San-Ei Kagaku Co. Ltd., or equivalent substitute from different supplier). These ink filled holes are more reliable than non-filled holes because the cured ink plug acts as support to the hole-wall and keeps it in place. In addition, the conductive ink filled holes are more conductive to electrical signals and also dissipate more heat than non-filled holes.

However, reliability problems may still occur with these printed circuit boards having the ink filled holes. These reliability problems typically occur during the component assembly process of the printed circuit boards because this is when the printed circuit boards are exposed to a series of thermal heat excursions. It is during these thermal heat excursions that a conductor on a surface (e.g., a copper plated cap) of a plated through-hole that is filled with ink materials can separate from the electrolytic copper plated hole-wall as shown in FIGS. 1A, 1B, 2A, and 2B.

In order to help reduce this separation, IPC (Association Connecting Electronics Industries) introduced some new requirements known as "wraparound plating thickness" (IPC-6012B Amendment 1—December 2006 Qualification and Performance Specification for Rigid Printed Boards). This wraparound copper does help to reduce the occurrence of surface conductor separation from holes with barrel-plated copper as shown in FIGS. 3 and 4.

However, the wraparound plating thickness does not completely eliminate the occurrences of circuit board failures, such as surface conductor separation from holes with barrel-plated copper as shown in FIGS. 5 and 6. There is constant ongoing effort in the PCB manufacturing industry to create a balance between wrap thickness and design of the board, e.g., line width, spacing between features, number of wraps needed on any conductor layer. The main reasons for the occurrence of these circuit board failures are:

1. Inconsistent wrap thickness on the board due to inconsistent plating thickness distribution on the panel.
2. Inconsistent wrap thickness left on the board due to inconsistent planarization after the via fill process on the panel in order to remove excess via fill material from the surface of the panel.

At the same time, the wraparound plating thickness makes it very difficult and almost impossible to manufacture some of the designs with sequential lamination cycles and/or designs with multiple blind via holes that start at a common conductor layer. Each wraparound process increases the surface plated copper by approximately 0.0005". This increase in the surface plated copper reduces the space between traces, limiting the ability to produce fine line conductors with tight spacing on the layers with wrap plating.

Furthermore, the conductive or non-conductive ink filled holes need to be planarized (leveled) after the through-holes are filled with ink and cured. Occasionally, this planarization operation removes the wraparound copper that was previously plated. The printed circuit boards with no wraparound copper are subject to rejection as per IPC-6012B. This condition renders the printed circuit boards susceptible to have the copper plated cap separated from the hole-wall as shown FIGS. 1 and 2. Unfortunately and as mentioned above, this separation of the cap from the hole-wall may happen during the component assembly process.

SUMMARY OF THE INVENTION

Aspects of embodiments of the present invention are directed toward methods, systems and/or apparatus (1) to enhance the consistency of the wraparound plating of holes of printed circuit boards with (requiring) via filling to provide extra reliability to the printed circuit boards and/or (2) to enable the designers and/or manufacturers of printed circuit boards to design and manufacture boards with relatively fine features and/or tight geometries.

In one embodiment of the present invention and referring to FIGS. 16A and 16B, a printed circuit broad is provided with a plurality of etch clearances bigger than the through-holes (FLAT-WRAP™ (a trademark of DDI Corp.) Process Step S2) followed by the formation of the through-holes (FLAT-WRAP™ Process Step S3) to connect copper patterns on different layers of the printed circuit broad. Here after electroless copper (or coppering) (FLAT-WRAP™ Process Step S4) to provide conductive surface inside the through-holes and the etched clearance around the through-holes, the through-holes are imaged (FLAT-WRAP™ Process Step S5) with bigger dot pattern (or dot) than the etched clearance in FLAT-WRAP™ Process step S2 and plated to desired thickness on the through-hole wall (FLAT-WRAP™ Process Step S6) as per IPC or as needed. Here, after resist stripping (FLAT-WRAP™ Process Step S7) the imaged and plated through-hole is filled with conductive or non-conductive via fill material (FLAT-WRAP™ Process Step S8) and cured. After curing the filled through-holes are planarized (FLAT-WRAP™ Process Step S9) to remove the excess via fill material and copper dots plated on the solid copper layer around the through-holes and etched clearances down to the level of the copper surface. The through-holes after via fill and planarization to the surface copper level are processed through electroless copper process to metalize the via fill material, imaged and electrolytic copper plated to form the cap over the entire through-holes including plated copper wraps and via fill materials. This embodiment of this invention enhances the consistency of the wrap thickness on the entire board surface when compared to the current method used in the industry, thereby providing extra reliability to the printed circuit board.

In one embodiment of the present invention, a method of manufacturing a printed circuit board having a plurality of circuit layers with through-holes to connect copper patterns on different layers of the printed circuits broad is provided. The method includes providing a consistent thickness wrap plate to at least one of the through-holes with electrolytic copper plating, via filling and planarizing, and then forming a surface conductor (or cap) over the filled barrel plated through-hole.

In one embodiment of present invention, a method of manufacturing a printed circuit board having a plurality of circuit layers by using special foil (e.g., a Mitsubishi, Primer Coated Foil or equivalent foil) in order to enhance the bond strength of the wraparound plate to the resin surface in the etched clearance around the through-hole vias.

An embodiment of the present invention provides a method of manufacturing a printed circuit board or a sub-component of the printed circuit board having a plurality of circuit layers with at least one hole for interconnecting copper patterns on the different circuit layers of the circuit board or the sub-component of the circuit board. The method includes: laminating the plurality of circuit layers with each other to form the circuit board or the sub-component of the circuit board with a first solid copper layer and a second solid copper layer respectively as both outermost layers of the circuit board or the sub-component of the circuit board; selectively removing a portion of the first solid copper layer and/or the second solid copper layer to form a clearance for drilling the hole; drilling the hole into the laminated circuit layers at the clearance; metalizing the circuit layers with the drilled hole to metalize the hole; coating a photo resist on both the outermost layers; patterning the photo resist on the circuit layers with a photo dot to expose the clearance and the metalized hole; electrolytic copper plating the metalized hole with the electrolytic plating solution to plate the metalized hole to a desired copper thickness in the metalized hole and with copper wrap continuously wrapping from the hole wall onto an outer surface in the clearance around the metalized hole; stripping the photo resist; filling the copper plated hole with a via fill material; curing the via fill material in the via filled hole; planarizing the via fill material and the plated copper wrap in the clearance around the plated hole to a level substantially the same as the level of the first solid copper layer and/or the second solid copper layer; and forming a conductive image to cover the filled and planarized hole along with the planarized copper wrap. Here, the hole can be but not limited to, a drilled hole by mechanical drilling, a laser drilled hole, or a combination of mechanical and laser drilled hole, or a water jet drilled hole.

The method may further include metalizing the circuit layers with the clearance to metalize the clearance, prior to the drilling of the hole into the laminated circuit layers at the metalized clearance. The metalizing of the circuit layers with the clearance may include electroless copper plating the clearance by utilizing a smear removal process. Alternatively, the metalizing of the circuit layers with the clearance may include electroless copper plating the clearance without utilizing a smear removal process.

In one embodiment, the metalizing of the drilled circuit layers with the drilled hole to metalize the hole includes de-smearing (smear removal process) the drilled hole, and electroless copper plating the de-smeared hole.

In one embodiment, a circumference of the clearance is bigger in size than that of the drilled hole. In one embodiment, a circumference of the photo dot is not less in size than that of the clearance. In one embodiment, a circumference of the clearance is bigger in size than that of the drilled hole, and a corresponding circumference of the photo dot for selective barrel plate is bigger in size than that of the clearance.

In one embodiment, the laminating of the plurality of circuit layers includes laminating a plurality of substrates with each other, each of the plurality of substrates being interposed between one and a corresponding one of the plurality of circuit layers, the plurality of substrates include a resin, and the removing of the copper foil to form the clearance includes selectively removing the copper foil down to the resin.

In one embodiment, the clearance is created only on one of the outermost layers. In an alternative embodiment, the clearance is created on both the outermost layers.

In one embodiment, the drilled hole is a through-hole. In an alternative embodiment, the drilled hole is drilled without going through the entire thickness of the circuit board or the sub-component of the circuit board.

In one embodiment, the patterning of the photo-resist includes dot imaging both the outmost layers. In an alternative embodiment, the patterning of the photo-resist includes dot imaging only one layer of the outmost layers and circuit imaging the other layer of the outmost layers.

In one embodiment, the laminating of the plurality of circuit layers includes laminating a plurality of substrates with each other, each of the plurality of substrates being interposed between one and a corresponding one of the plurality of circuit layers, the plurality of substrates include a resin, and the removing of the copper foil to form the clearance includes selectively removing the copper foil without exposing the resin.

Another embodiment of the present invention provides a method of manufacturing a printed circuit board or a sub-component of the printed circuit board having a plurality of circuit layers with at least one hole for interconnecting copper patterns on the different circuit layers of the circuit board or the sub-component of the circuit board. The method includes: laminating the plurality of circuit layers with each other to form the circuit board or the sub-component of the circuit board with a first solid copper layer and a second solid copper layer respectively as both outermost layers of the circuit board; drilling the hole into the laminated circuit layers; de-smearing the drilled hole; selectively removing a portion of the first solid copper layer and/or the second solid copper layer to form a clearance to correspond to the de-smeared hole; metalizing the circuit layers with the de-smeared hole and the corresponding clearance to metalize the de-smeared hole; coating a photo resist on both the outermost layers; patterning the photo resist on the circuit layers with a photo dot to expose the metalized hole; electrolytic copper plating the metalized hole with the electrolytic plating solution to plate the metalized hole to a desired copper thickness in the metalized hole and with a copper wrap continuously wrapping from the hole wall onto an outer surface in the clearance around the metalized hole; stripping the photo resist; filling the copper plated hole with a via fill material; curing the via fill material in the via filled hole; planarizing the via fill material and the plated copper wrap in the clearance around the plated hole to a level substantially the same as the level of the first solid copper layer and/or the second solid copper layer; and forming a conductive image to cover the filled and planarized hole with the planarized copper wrap.

In one embodiment, the metalizing of the drilled circuit layers includes electroless copper plating the clearance and the de-smeared hole.

In one embodiment, a circumference of the clearance is bigger in size than that of the drilled through-hole, and wherein a circumference of the photo dot is not smaller in size than that of the clearance.

Another embodiment of the present invention provides a method of manufacturing a printed circuit board or a sub-component of the printed circuit board having a plurality of circuit layers with at least one hole for interconnecting copper patterns on the different circuit layers of the circuit board or the sub-component of the circuit board. The method includes: laminating the plurality of circuit layers with each other to form the circuit board or the sub-component of the circuit board with a first solid copper layer and a second solid copper layer respectively as both outermost layers of the circuit board; drilling the hole into the laminated circuit layers; de-smearing the drilled hole; metalizing the circuit layers with the de-smeared hole to metalize the hole; coating a first photo resist on both the outermost layers; patterning the first photo resist on the circuit layers with a first photo dot to expose the metalized hole; electrolytic copper plating the metalized hole with a electrolytic plating solution to plate the metalized hole to a desired copper thickness; stripping the first photo resist; planarizing the plated first photo dot around the plated hole down to a level substantially the same as the level of the at least one of the first solid copper layer or the second solid copper layer; selectively removing a portion of at least one of the first solid copper layer or the second solid copper layer to form a clearance to correspond to the plated hole; metalizing the circuit layers with the plated hole and the clearance to metalize the clearance around the hole; coating a second photo resist on both the outermost layers; patterning the second photo resist on the circuit layers with a second photo dot to expose the metalized clearance and the hole; electrolytic copper plating the hole with the electrolytic plating solution to plate the hole to a desired copper thickness in the metalized hole and with a copper wrap continuously wrapping from the hole wall onto an outer surface in the clearance around the hole; stripping the second photo resist; filling the copper plated hole with a via fill material and curing the via fill material in the via filled hole; planarizing the via fill material and the plated copper wrap in the clearance around the plated hole to a level substantially the same as the level of the at least one of the first solid copper layer and/or the second solid copper layer; and forming a conductive image to cover the filled and planarized hole with the planarized copper wrap.

In one embodiment, the metalizing the circuit layers with the de-smeared hole includes electroless copper plating the de-smeared hole, and the metalizing the circuit layers with the plated hole and the clearance includes electroless copper plating the clearance and the plated hole.

In one embodiment, a circumference of the clearance is bigger in size than that of the drilled hole, and a circumference of the second photo dot is not smaller in size than that of the clearance.

In one embodiment, the laminating of the plurality of circuit layers includes laminating a plurality of substrates with each other, each of the plurality of substrates being interposed between one and a corresponding one of the plurality of circuit layers, the plurality of substrates include a resin, and the removing of the portion of the first solid copper layer or the second solid copper layer (or the copper foil) to form the clearance includes selectively removing the portion of the first solid copper layer and/or the second solid copper layer (or the copper foil) down to the resin.

In one embodiment of the present invention, the laminating of the plurality of circuit layers includes laminating a plurality of substrates with each other, each of the plurality of substrates being interposed between one and a corresponding one of the plurality of circuit layers, the plurality of substrates include a resin, and the removing of the portion of the first solid copper layer and/or the second solid copper layer (or the copper foil) to form the clearance includes selectively removing the portion of the first solid copper layer and/or the second solid copper layer (or the copper foil) without exposing the resin.

BRIEF DESCRIPTION OF THE DRAWINGS

The accompanying drawings, together with the specification, illustrate exemplary embodiments of the present invention, and, together with the description, serve to explain the principles of the present invention.

The patent or application file contains at least one drawing/picture executed in color. Copies of this patent or patent application publication with color drawing/picture(s) will be provided by the Office upon request and payment of the necessary fee.

FIGS. 1A, 1B, 2A, and 2B are views showing that a plated through-hole with varying degree of wrap plate over the foil at the knee of the through-hole and filled with ink materials can separate from an electrolytic copper plated hole-wall.

FIGS. 16A and 16B are views for illustrating a process flow for manufacturing a printed circuit with a though-hole to connect patterns on different layers of the circuit board according to an embodiment of the present invention.

FIGS. 19A and 19B are views for illustrating a process flow for manufacturing a printed circuit with a though-hole to connect patterns on different layers of the circuit board according to another embodiment of the present invention.

FIGS. 20A and 20B are views for illustrating a process flow for manufacturing a printed circuit with a though-hole to connect patterns on different layers of the circuit board according to another embodiment of the present invention.

FIGS. 21A, 21B and 21C are views for illustrating a process flow for manufacturing a printed circuit with a though-hole to connect patterns on different layers of the circuit board according to another embodiment of the present invention.

DETAILED DESCRIPTION

Figure 3:
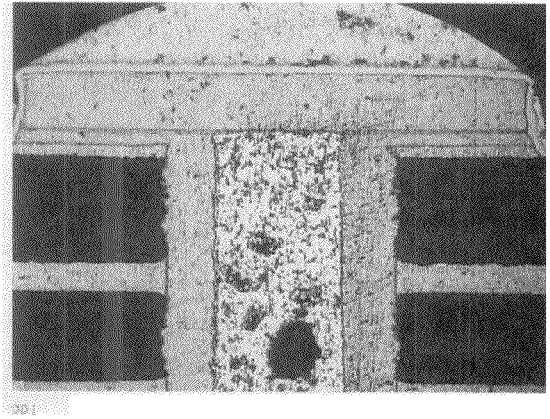
FIGS. 3 and 4 are views showing a wraparound copper wrapping over the foil does help to reduce the occurrence of surface conductor separation from holes with barrel-plated copper but increases the surface copper thickness, which makes it difficult to manufacture some tight geometry designs.
Figure 4:
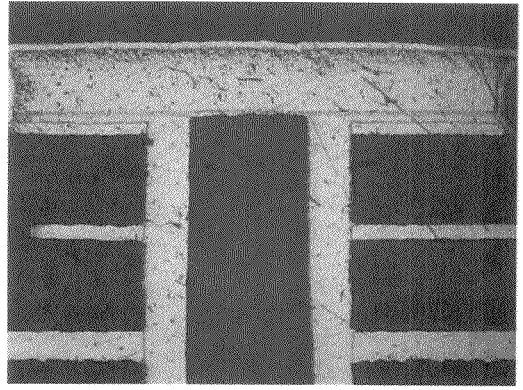
Figure 5:
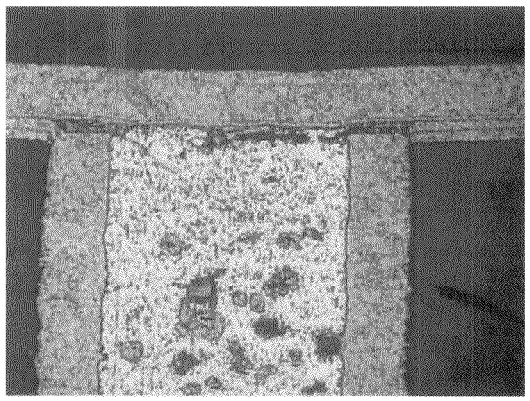
FIGS. 5 and 6 are views showing a lower wraparound plating thickness does not completely eliminate the occurrences of surface conductor separation from holes with barrel-plated copper. Lower wrap plate is normally chosen because of tighter designs and geometries.
Figure 6:
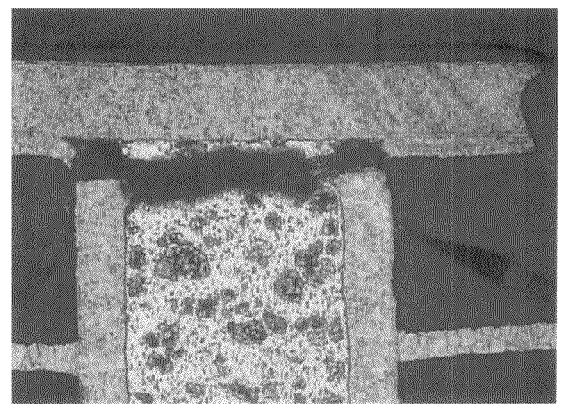

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive.

In the context of the present invention, holes refer to through-, blind-, buried-, and/or micro-vias and/or holes. In addition, metalization, metalize, and/or metalizing refer to electroless copper (or electroless coppering) or alternate Metalizing process using, e.g., Shadow process (Electrochemicals, Inc.), Eclipse Process (McDermid, Inc.), Dylex process (Okuno Chemical), etc.

Here, holes are drilled and plated with copper to the minimum required hole wall thickness in the printed circuit boards to connect copper patterns on different layers. In one embodiment, one or more of the holes are formed by mechanical drilling with a mechanical drill (instead of. e.g., laser drilling). Some non-component holes are filled with conductive or non-conductive via fill material. This is done to provide extra reliability and to enhance the thermal characteristics of these holes. After some early failures of surface conductor separating from the barrel plated copper, IPC put in place certain wraparound plate requirements in order to increase the reliability of the filled holes. These wraparound requirements forced the manufacturers to add extra copper to the surface copper thickness, which in turn made it difficult to manufacture boards with finer and tighter features. An embodiment of the present invention provides an alternative method to wrap the copper around the knee of the hole while maintaining the surface copper thickness very close to the starting surface copper thickness. This is done to help facilitate the manufacturability and increase the reliability of printed circuit board designs with hole fill requirements. In one embodiment of the present invention, the wraparound plate has the same (or substantially the same) thickness as the surface copper left on the surface after hole fill and planarization. In another embodiment of the present invention, the starting surface copper can be chosen from any suitable thickness ranging from ⅛ oz to 4 oz copper foil. In yet another embodiment of the present invention, the copper foil thickness will be chosen from ⅜ oz, ½ oz, ¾ oz, or 1 oz.

In one embodiment of the present invention, a printed circuit board includes one or more circuit cores, substrates, or carriers. In one fabrication scheme for the printed circuit board having the one or more circuit carriers, electronic circuitries (e.g., pads, electronic interconnects, etc.) are fabricated onto opposite sides of an individual circuit carrier to form a pair of circuit layers. These circuit layer pairs of the circuit board may then be physically and electronically joined to form the printed circuit board by utilizing an adhesive (or a prepreg or a bond ply), stacking the circuit layer pairs and the adhesives in a press, curing the resulting circuit board structure, drilling holes, and then plating the holes with copper, as described in more detail below, to interconnect the circuit layer pairs.

In one embodiment, the printed circuit board includes at least four circuit layers. In one embodiment, the printed circuit board includes at least five circuit layers. In one embodiment, the printed circuit board includes at least six circuit layers. In one embodiment, the printed circuit board includes at least seven circuit layers. In one embodiment, the printed circuit board includes at least eight circuit layers.

In addition, the printed circuit board according to one embodiment of the present invention includes a plurality of substrates, each of the plurality of substrates being interposed between one and a corresponding one of the plurality of circuit layers. Here, in one embodiment, one or more of the plurality of substrates includes a core material selected from the group consisting of metal, ceramic, FR4, GPY, and combinations thereof.

In one example, manufacturing process steps after a lamination operation having a wraparound plating thickness are as follows:

1. Drill;
2. Electroless Copper;
3. Panel Plate (0.0004"-0.0008")—for wraparound copper;
4. Clean/Re-Electroless Copper;
5. Resist Coat;
6. Photo (Dot Pattern) for Holes;
7. Electroplate—To final customer plating thickness requirements;
8. Resist Strip;
9. Via Fill—Conductive or Non-Conductive;
10. Planarize—With care to minimize wraparound plate reduction;
11. Electroless Copper—to metalize the cap;
12. Resist Coat;
13. Photo—Image Conductor Pattern;
14. Plate Image;
15. Resist Strip; and
16. Etch An embodiment of the present invention eliminates the added plated copper thickness over the surface copper and provides more consistent wrap plating thickness on the entire surface of the printed circuit board as shown in FIGS. 14 and 15. This helps to hold in place the bond between the surface conductor copper and the plated hole wall copper while making it now possible to manufacture the boards with finer features and tighter geometries.

Figure 17:
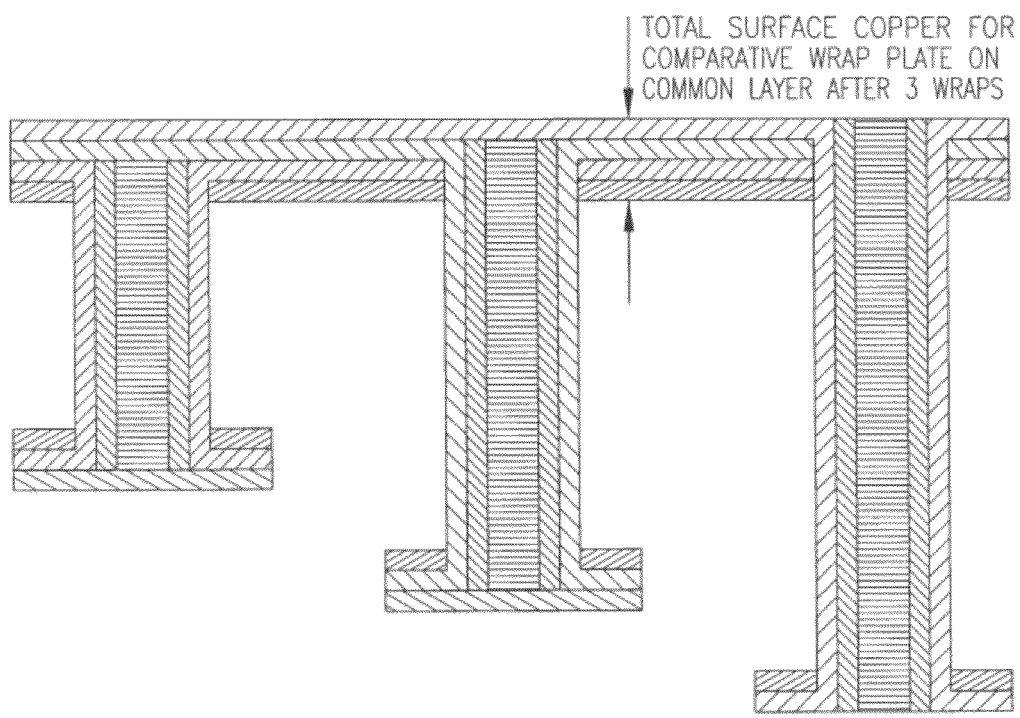
FIG. 17 shows a copper thickness buildup over foil during wrap plating processes on a common layer of three different via-fill through-holes according to a comparative example.
Figure 18:
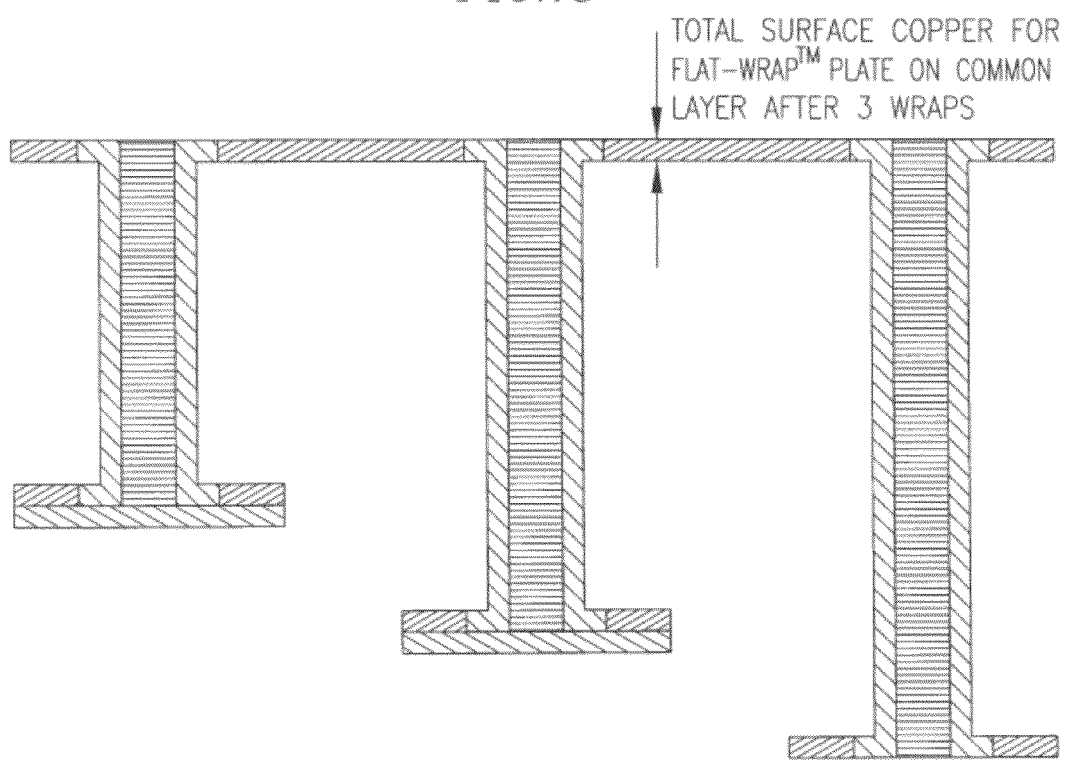
FIG. 18 shows no copper thickness buildup over foil during wrap plating processes on a common layer of three different via-fill through-holes according to an embodiment of the present invention. The wrap plating thickness is at the same (or substantially the same) height as the starting surface copper thickness.
Figure 19B:
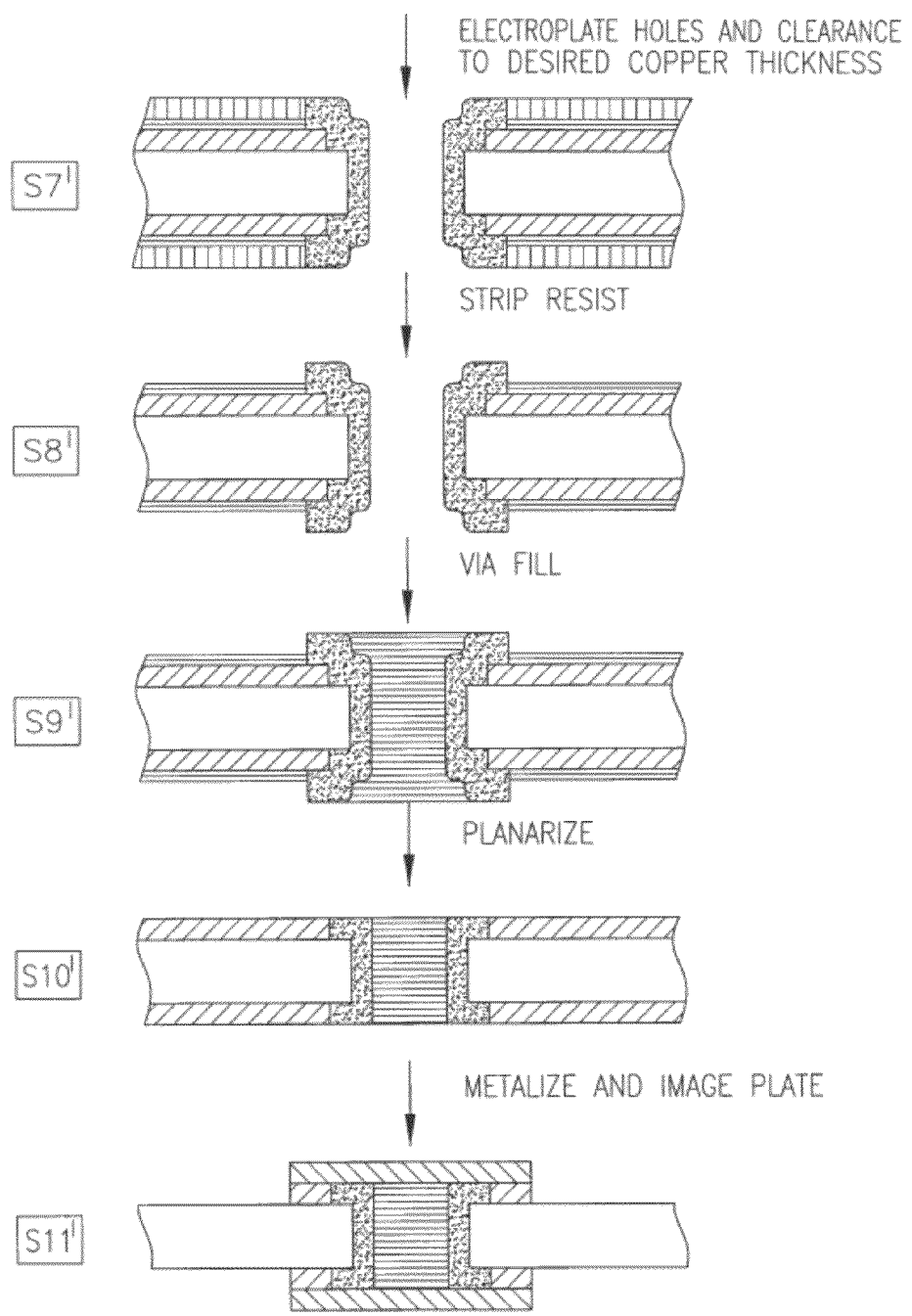
Figure 20B:
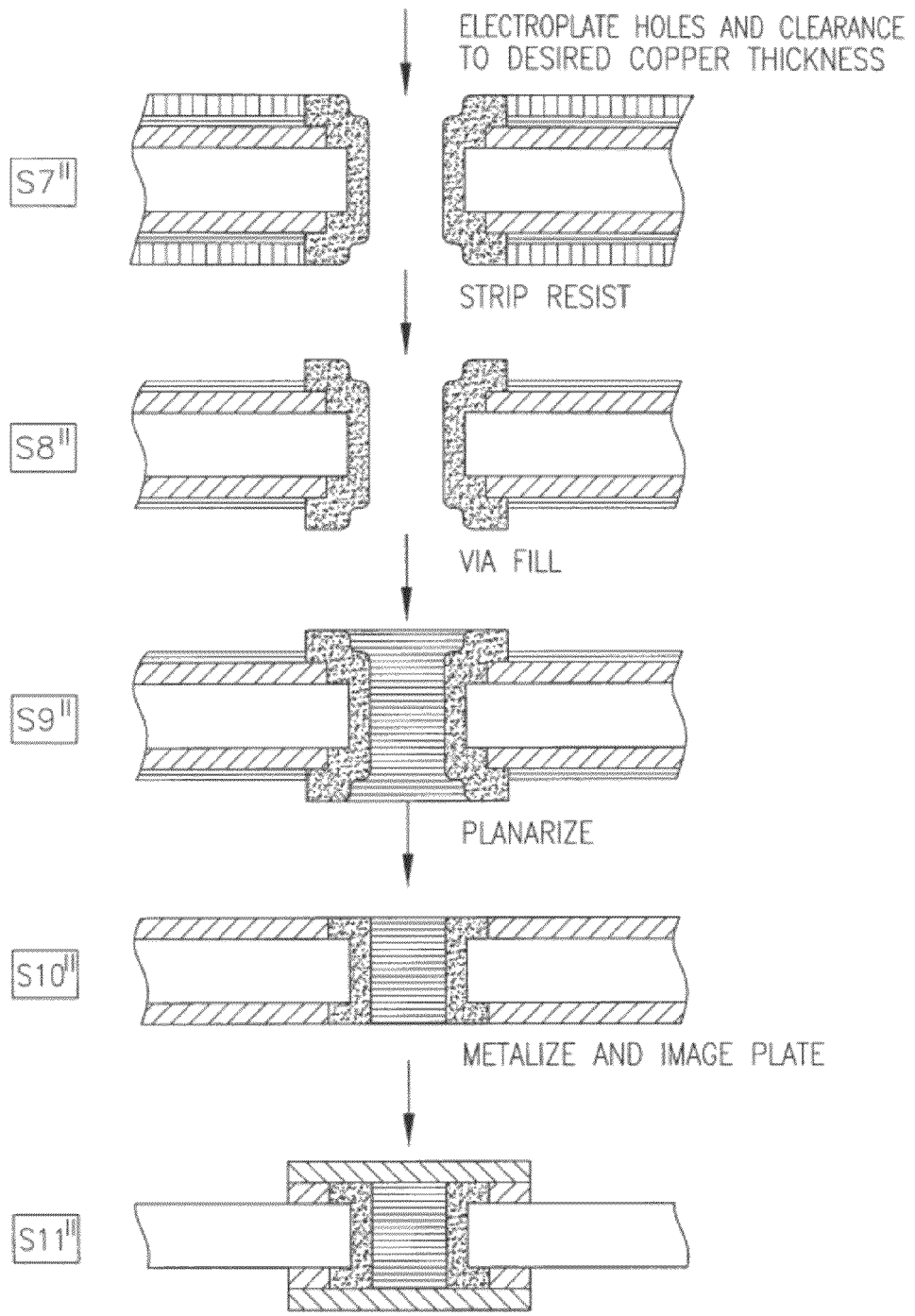

FIGS. 17 and 18 show a schematic difference in total copper thickness between a printed circuit board formed by a wrap plating process according to a comparative example, and a printed circuit board formed by a FLAT-WRAP™ plating process according to an embodiment of the present invention. In FIG. 18, the wrap plating thickness is at the same (or substantially the same) height as the starting surface copper thickness. In one embodiment, the level of the copper wrap is within a range from about +0.0002" to about −0.0002" of the starting surface copper thickness of the corresponding layer.

Figure 14A:
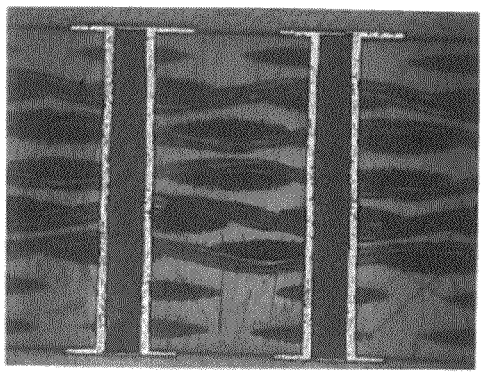
FIGS. 14A, 14B and 14C are views showing embodiments of through-hole with FLAT-WRAP™ with no thermal stress.
Figure 14B:
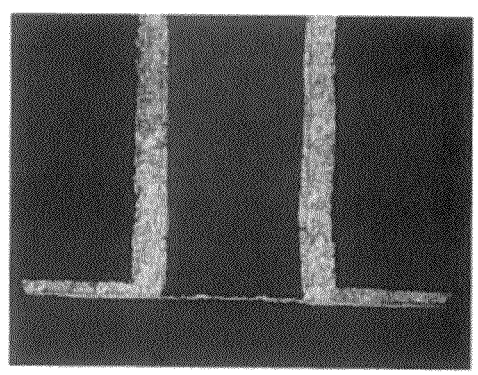
Figure 14C:
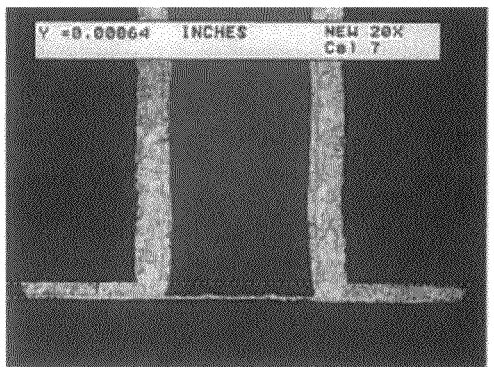

Referring to FIGS. 14A, 14B and 14C, one embodiment of the present invention provides one or more plated through-holes with wraparound plate without any added copper build-up over the starting first solid copper layer thickness and/or the second solid copper layer. A surface conductor (or cap) is then created over the surface by adding electroless copper and then electroplating electrolytic copper over the barrel plated and filled through-hole. In more detail, FIGS. 14A, 14B and 14C show through-holes with FLAT-WRAP™ (a trademark of DDI Corp.) around copper prior to being thermal stressed (no thermal stress).

Figure 15A:
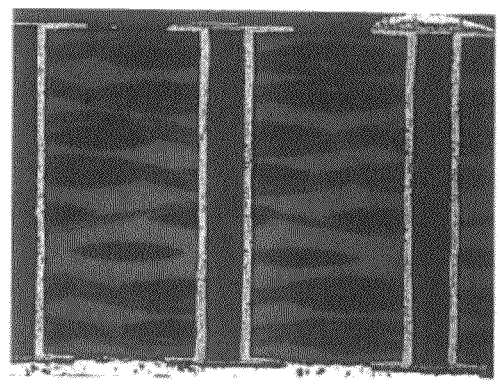
FIGS. 15A, 15B and 15C are views showing embodiments of through-hole with FLAT-WRAP™ with 5× thermal stress at 550 F for 10 seconds each.
Figure 15B:
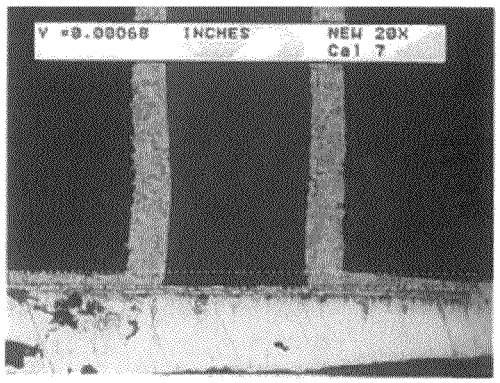
Figure 15C:
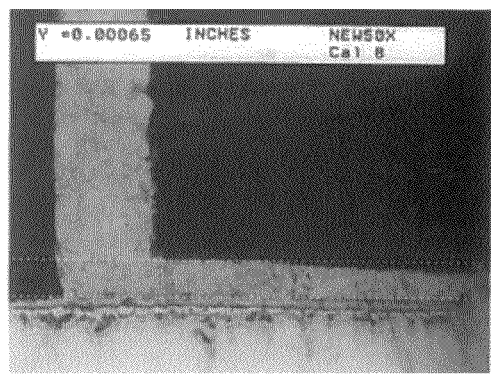

Because of consistent and robust wrap copper thickness, the surface conductor does not separate from the hole wall of the electroplated and filled through-hole even under extreme thermal stress conditions. That is, FIGS. 15A, 15B and 15C show through-holes with FLAT-WRAP™ after being thermal stressed (5× thermal stress at 550 F for 10 seconds each time stress). As can be seen in FIGS. 15A, 15B and 15C, the through-holes with FLAT-WRAP™ around copper do not exhibit any deterioration in the copper cap bond to the electroplated hole wall of a through-hole filled with via fill material.

A reason why there is no deterioration in copper cap bond to plated copper barrel is because embodiments of the present invention maximize (or increase) the wrap plate thickness without compromising for design considerations. To put it another way and as shown in FIGS. 14A, 14B, 14C, 15A, 15B, and 15C, embodiments of the present invention provide consistent (or uniform) wrap plate thickness with relatively higher strength.

In view of the foregoing, embodiments of the present invention not only provide a much better strength with maximum (or increase) wrap plate thickness, but also open up endless opportunities for the designers to design and manufacturers to manufacture the printed circuit boards with relatively finer lines and tighter geometries.

Embodiments of the present invention provide some of the following benefits:

1. Constant wraparound plate thickness matching the thickness of the surface foil. In one embodiment, the level of the constant wraparound plate thickness (or copper wrap) is within a range from about +0.0002" to about −0.0002" of the starting foil thickness of the corresponding copper layer.
2. Increased reliability due to EVEN wraparound plate thickness over the entire surface of the board.
3. No Surface copper thickness build-up during multiple wraparound plates on a common layer for via-fill through-holes.
4. EVEN surface copper helps to manufacture designs with fine lines and tighter geometries.
5. No surface panel plate to achieve required wrap over the starting foil thickness helps in planarization after via fill process because the copper over the entire surface of the board is EVEN.
6. No surface panel plate to achieve required wrap over the starting foil thickness eliminates copper thickness distribution issues leading to technology enhancement and increased yield due to improved etching.
7. No Surface copper thickness build-up over the starting foil thickness leading to environmental and cost savings.
8. Consistent impedance values on the plated layers with copper filled holes. This is because of the minimum copper and more even surface plated distribution obtained by the embodiments of the present invention.
9. Improved dielectric thickness on all sub-laminations between the sub-outer plated layer and the subsequent laminated layer.
10. Lower and Even Copper thickness on wrap plate layers will help reduce the overall board thickness and also reduce the board thickness tolerance variance.
11. The ability to produce tighter designs will help designers to design tighter geometry boards.

Figure 7A:
FIGS. 7A, 7B, and 7C are views showings a circuit board including a copper foil laminated on opposite sides of the circuit board.
Figure 7B:
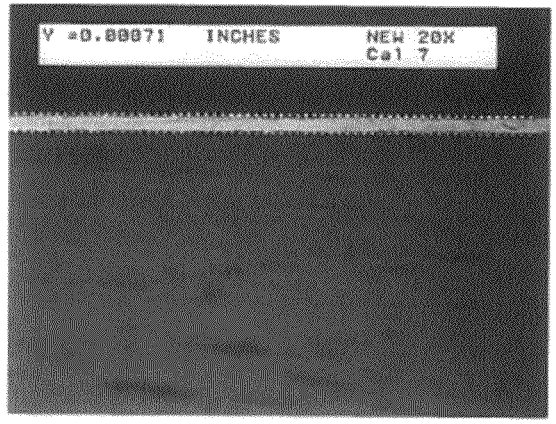
Figure 7C:
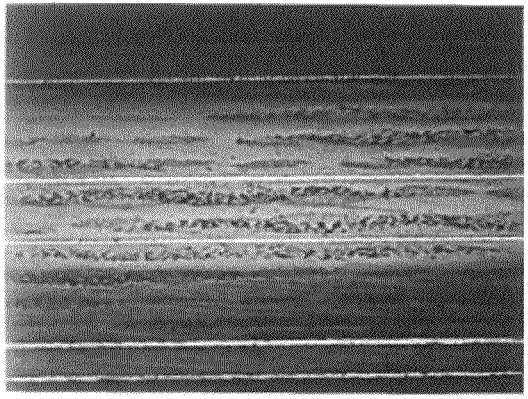
Figure 8A:
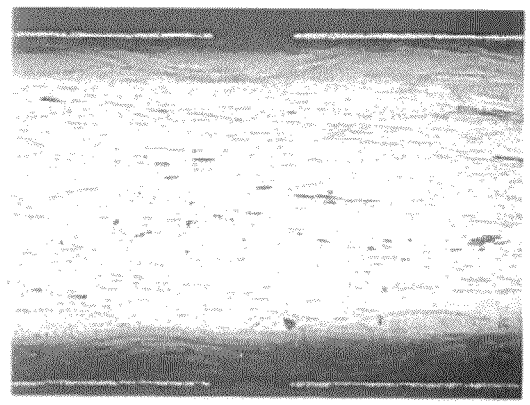
FIGS. 8A and 8B are views showing a circuit board that has been printed and selective etched to form clearances for drilling via fill holes.
Figure 8B:

In one embodiment of the present invention and referring to FIGS. 16A and 16B, manufacturing process steps after lamination are as follows:

1. Here, the laminated circuit board is shown to include a copper foil on opposite sides of the circuit board. (Process Flow Step S1, FIGS. 7A, 7B, and 7C). In one embodiment, a core material of the circuit board between the two copper foils is made of ceramic, or insulating material (e.g., FR4, LCP, Thermount, BT, GPY, such as Teflon, thermally conducting carbon (stablecor), halogen free, etc., wherein GPY is a laminate that does not fit in the FR4 category, such as polyimide, aziridine cured epoxy, bismalimide, and other electrical grades of laminate). The present invention, however, is not thereby limited. Also, in one embodiment and as shown in FIG. 7B, the copper foil on the substrate has a thickness of about 0.00071" (H Oz.). However, the present invention is not thereby limited.
2. The circuit board is then dot image printed and selective copper etched to form dot clearances for drilling via-fill through-holes. In one embodiment, the etched dot clearances are bigger in size (or diameter) than the via-fill through-holes. (Process Flow Step S2, FIGS. 8A and 8B).
3. Through-holes are then drilled through the circuit board at the etched clearances.

Figure 9A:
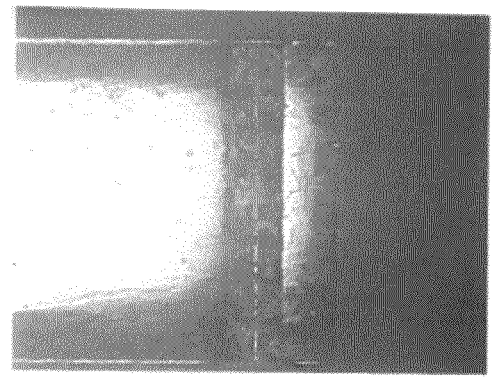
FIGS. 9A, 9B, and 9C are views showing via fill holes that are drilled through a circuit board at etched clearances.
Figure 9B:
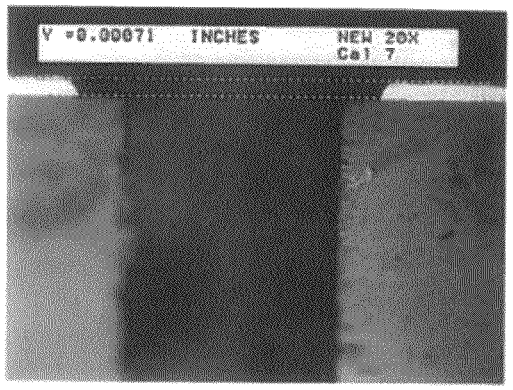
Figure 9C:
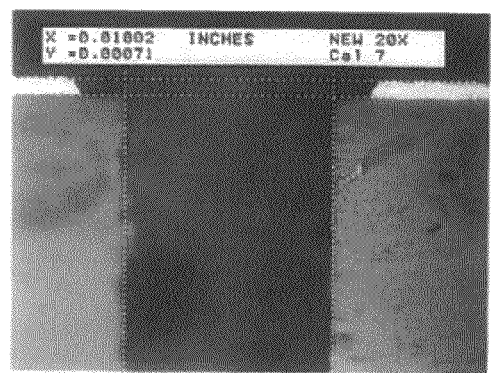

In one embodiment, the drilled through-holes are smaller in size (or diameter) than the etched clearances. (Process Flow Step S3, FIGS. 9A, 9B, and 9C)

Figure 10:
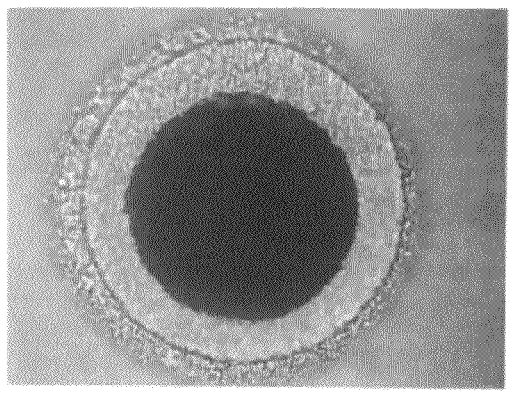
FIG. 10 is a view showing drilled hole and clearance after processing through electroless copper and photo dot image pattern to correspond with drilled holes.
Figure 11A:
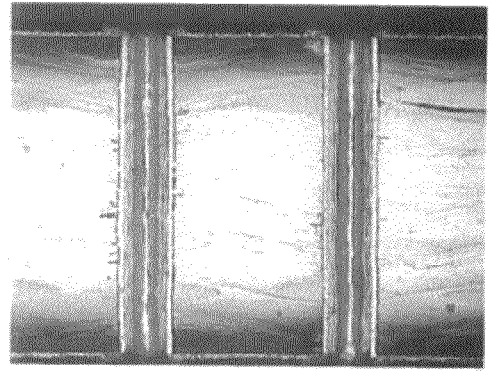
FIGS. 11A, 11B, and 11C are views showing selective barrel plate (or barrel plating) to plate desired copper thickness in through-holes.
Figure 11B:
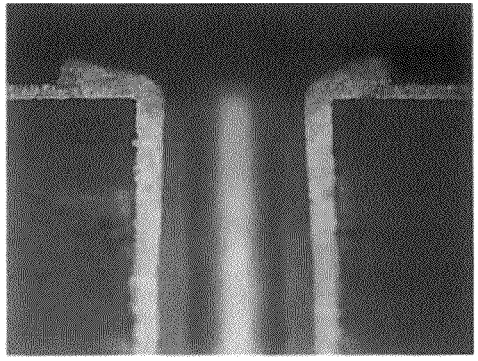
Figure 11C:
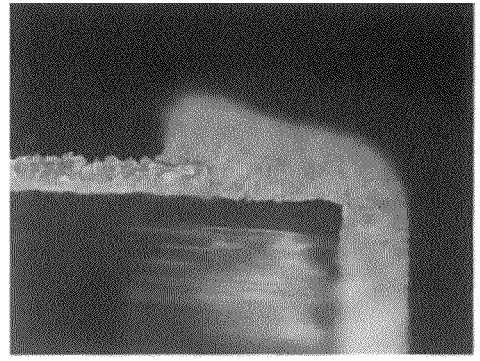
Figure 12A:
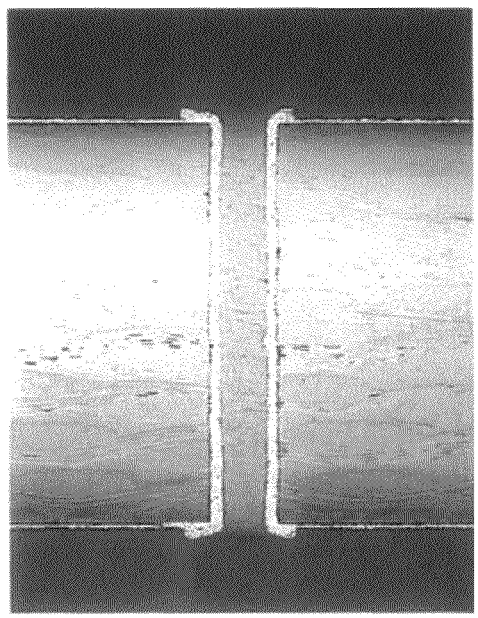
FIGS. 12A and 12B are views showing through-holes after via fill with conductive or non-conductive paste (or material).
Figure 12B:
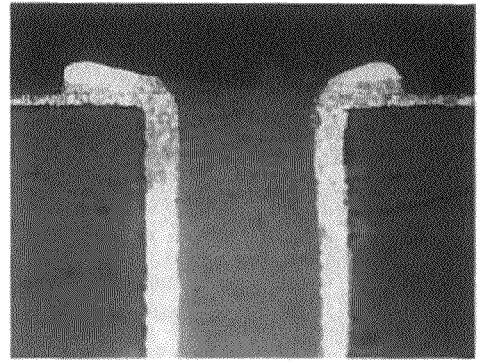
Figure 13A:
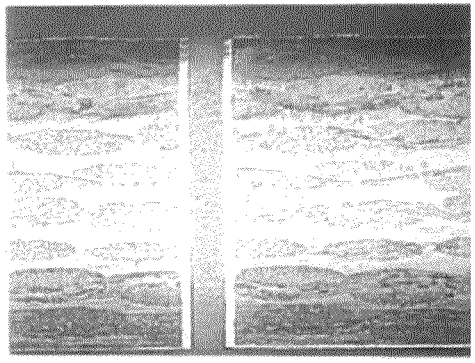
FIGS. 13A and 13B are views showing a state where excess materials (e.g., the plated copper and the filled paste) are planarized to the starting surface copper level. (Process Flow S8, FIGS. 13A and 13B).
Figure 13B:
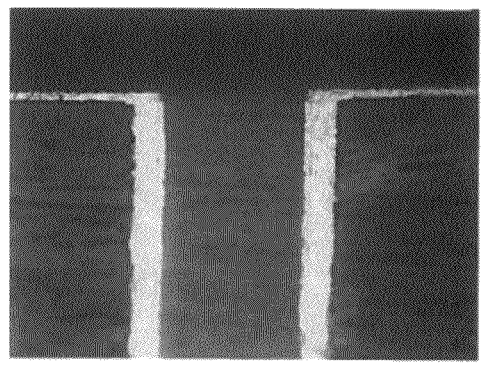

4. Electroless copper (or electroless coppering) is then performed to metalize the through-holes and etched clearances. (Process Flow Step S4, FIG. 10).
5. Photo dot patterns (or dots) are then formed to correspond to the through-holes. In one embodiment, the dots are bigger in size (or diameter) than the selective etched clearances. (Process Flow Step S5, FIG. 10).
6. Barrel Plate (or barrel plating) is then performed to plate desired copper thickness in the through-holes. (Process Flow Step S6, FIGS. 11A, 11B, and 11C).
7. Resist used to form dot patterns above is then stripped from the circuit board. (Process Flow Step S7).
8. The through-holes are then via filled with conductive or non-conductive paste (or material). (Process Flow Step S8, FIGS. 12A and 12B)
9. Excess materials (e.g., the plated copper and the filled paste) are then planarized to the surface copper/copper foil level. (Process Flow Step S9, FIGS. 13A and 13B) In one embodiment, the level of the copper wrap is planarized to within a range from about +0.0002" to about −0.0002" of the starting surface copper/starting copper foil thickness of the corresponding copper layer.
10. Circuit board is then processed through electroless copper again to metalize the via fill material to form the cap.

11. Another Photo resist is applied on the circuit board, and patterned to form circuit image(s) including the cap image(s) over the via-fill through-hole(s).
12. The circuit image(s) is then plated, resist stripped, and etched to form the circuits including the copper cap(s) over the via-fill through-hole(s). (Process Flow step S10, FIGS. 14A, 14B, and 14C).

In one embodiment, the electroless copper (or electroless coppering) includes four basic operations: cleaning, activation, acceleration, and deposition. In addition, an anti-tarnish bath may also be performed after deposition.

In more detail, the cleaning operation begins with a cleaner-conditioner designed to remove organics and condition a plurality of circuit layers (or a circuit board) with one or more through-holes for the subsequent uptake of catalyst. The cleaner-conditioners may include an alkaline solution.

The activation and acceleration operations may be performed through the use of a catalyst and two process tanks. That is, a pre-dip tank is used for the drag-in protection of the activation or catalyst bath, and usually contains hydrochloric acid and possibly tin or sodium chloride. The activation or catalyst bath includes hydrochloric acid, tin chloride, and/or a palladium chloride. The Sn+2 ion reduces the Pd+2 to Pd, which is deposited on the plurality of circuit layers with the one or more through-holes. The remaining Sn+2 and Sn+4 are selectively removed by the accelerator (also called the post-activator). Suitable accelerators include fluoboric acid and/or sulfuric acid with hydrazine.

The main constituents of the electroless copper chemistry are sodium hydroxide, formaldehyde, EDTA (or other chelater), and a copper salt. In the complex reaction, catalyzed by palladium, formaldehyde reduces the copper ion to metallic copper.

One embodiment of the present invention, the barrel plate (or plating) is an electrolytic copper plating process based on positively charged conductivity and reactions of the plating metals (i.e., copper) and electrons.

The process of the copper plating is made of four important parts:
1. Cathode—the negative electrode in electrolysis, where negative electrons are created and positive ions are discharged; it is the object (i.e., the circuit board) that is going to be plated;
2. Anode—positive electrode in the electrolysis, where negative ions are discharged and positive ions are created; it is of the same material as the plating metal;
3. Electrolyte—conducting medium where the flow of current is with the movement of matter (e.g., aqueous solutions such as acids, bases and salts);
4. Direct current—the electricity that passes from the anode to the cathode.

Here, in the plating process, as the direct current passes from the anode through the electrolyte, it brings positive ions of the plating metal to the cathode. It is then joined with negative electrons created by the cathode and transforms into the metal coating. The metal coating bonds to the cathode and thus the electroplating process is complete.

In another embodiment of the present invention and referring to FIGS. 19A, 19B, 20A and 20B, manufacturing process steps after lamination are as follows:
1. Here, the laminated circuit board broad is shown to include a copper foil formed on opposite sides of the circuit board. (Process Flow Step S1', S1", FIGS. 7A, 7B, and 7C) In one embodiment, a core material of the circuit board between the two copper foils is made of ceramic, or insulating material (e.g., FR4, LCP, Thermount, BT, GPY, such as Teflon, thermally conducting carbon (stablecor), halogen free, etc., wherein GPY is a laminate that does not fit in the FR4 category, such as polyimide, aziridine cured epoxy, bismalimide, and other electrical grades of laminate). The present invention, however, is not thereby limited. Also, in one embodiment and as shown in FIG. 7B, the copper foil on the substrate has a thickness of about 0.00071" (H Oz.). However, the present invention is not thereby limited.
2. The circuit board is then dot image printed and selective copper etched to form dot clearances for drilling via-fill through-holes. In one embodiment, the etched dot clearances are bigger in size (or diameter) than the via-fill through-holes. (Process Flow Step S2', S2", FIGS. 8A and 8B)
3. The etched clearances are then metalized by using electroless copper process without smear removal process (Process Flow Step S3', FIG. 19A) or alternate Metalizing process (Process Flow Step S3", FIG. 20A) using Shadow process (Electrochemicals, Inc.), Eclipse Process (McDermid, Inc.), etc. without smear removal process followed by copper electroplating to complete Metalizing process for Shadow or Eclipse processes.
4. Through-holes are then drilled through the circuit board at the etched and metalized clearances. In one embodiment, the drilled through-holes are smaller in size (or diameter) than the etched and metalized clearances. (Process Flow Step S4', S4").
5. Electroless copper (or electroless coppering) is then performed to metalize the through-holes and etched clearances (Process Flow Step S5', FIG. 19A, FIG. 10) or the though-holes are metalized using alternate Metalizing process (Process Flow Step S5", FIG. 20A) using Shadow process (Electrochemicals, Inc.), Eclipse Process (McDermid, Inc.), etc.
6. Photo dot patterns (or dots) are then formed to correspond to the through-holes. In one embodiment, the dots are bigger in size (or diameter) than the selective etched clearances. (Process Flow Step S6', S6", FIG. 10)
7. Barrel Plate (or barrel plating) is then performed to plate desired copper thickness in the through-holes. (Process Flow Step S7', S7", FIGS. 11A, 11B, and 11C)
8. Resist used to form dot patterns above is then stripped from the circuit board. (Process Flow Step S8', S8")
9. The through-holes are then via filled with conductive or non-conductive paste (or material). (Process Flow Step S9', S9", FIGS. 12A and 12B)
10. Excess materials (e.g., the plated copper and the filled paste) are then planarized to the foil level. (Process Flow Step S10', S10", FIGS. 13A and 13B). In one embodiment, the level of the copper wrap is planarized to within a range from about +0.0002" to about −0.0002" of the starting foil thickness of the corresponding copper layer.
11. Circuit board is then processed through electroless copper again to metalize the via fill material to form the cap.
12. Another Photo resist is applied on the circuit board, and patterned to form circuit image(s) including the cap image(s) over the via-fill through-hole(s).
13. The circuit image(s) is then plated, resist stripped, and etched to form the circuits including the copper cap(s) over the via-fill through-hole(s). (Process Flow step S11', S11", FIGS. 14A, 14B, and 14C)

In another embodiment of the present invention and referring to FIGS. 21A, 21B and 21C, manufacturing process steps after lamination are as follows:
1. Here, the laminated circuit board broad is shown to include a copper foil formed on opposite sides of the circuit board. (Process Flow Step S1''', FIGS. 7A, 7B, and 7C) In one embodiment, a core material of the circuit board between the two copper foils is made of ceramic, or insulating material (e.g., FR4, LCP, Thermount, BT, GPY, such as Teflon, thermally conducting carbon (stablecor), halogen free, etc., wherein GPY is a laminate that does not fit in the FR4 category, such as polyimide, aziridine cured epoxy, bismalimide, and other electrical grades of laminate). The present invention, however, is not thereby limited. Also, in one embodiment and as shown in FIG. 7B, the copper foil on the substrate has a thickness of about 0.00071" (H Oz.). However, the present invention is not thereby limited.

2. Through-holes are then drilled through the circuit board. (Process Flow Step S2''').
3. Electroless copper (or electroless coppering) with de-smearing (smear removal process) is then performed to metalize the through-holes; or the through-holes are de-smeared and metalized using alternate Metalizing process (Process Flow Step S3''') using Shadow process (Electrochemicals, Inc.), Eclipse Process (McDermid, Inc.), etc.
4. First photo dot patterns (or first dots) are then formed to correspond to the through-holes. (Process Flow Step S4''').
5. Barrel Plate (or barrel plating) is then performed to plate desired copper thickness in the through-holes. (Process Flow Step S5''')
6. Resist used to form the first dot patterns above is then stripped from the circuit board. (Process Flow Step S6''')
7. Excess materials (e.g., the plated first dots around the plated holes) are then planarized to the surface copper/copper foil level. (Process Flow Step S7'''). In one embodiment, the level of the plated first dots are planarized to within a range from about +0.0002" to about −0.0002" of the starting surface copper/foil thickness of the corresponding copper layer.
8. The circuit board is then dot image printed and selective copper etched to form dot clearances to correspond to the plated through-holes. In one embodiment, the etched dot clearances are bigger in size (or diameter) than the through-holes. (Process Flow Step S8''')
9. The etched clearances are then metalized by using electroless copper process without smear removal process or alternate Metalizing process (Process Flow Step S9''') using Shadow process (Electrochemicals, Inc.), Eclipse Process (McDermid, Inc.), etc. without smear removal process followed by copper electroplating to complete Metalizing process for Shadow or Eclipse processes.
10. Second photo dot patterns (or second dots) are then formed to correspond to the through-holes. In one embodiment, the dots are bigger in size (or diameter) than the selective etched clearances. (Process Flow Step S10")
11. Barrel Plate (or barrel plating) is then performed to plate desired copper thickness in the through-holes with a copper wrap continuously wrapping from the hole walls onto outer surfaces and into the clearances around the holes. (Process Flow Step S11''')
12. Resist used to form the second dot patterns above is then stripped from the circuit board. (Process Flow Step S12''')
13. The through-holes are then via filled with conductive or non-conductive paste (or material). (Process Flow Step S13").
14. Excess materials (e.g., the plated copper and the filled paste) are then planarized to the surface copper/foil level. (Process Flow Step S15'''). In one embodiment, the level of the copper wrap is planarized to within a range from about +0.0002" to about −0.0002" of the starting surface copper/foil thickness of the corresponding copper layer.
15. Circuit board is then processed through electroless copper again to metalize the via fill material to form the cap.
16. Another Photo resist is applied on the circuit board, and patterned to form circuit image(s) including the cap image(s) over the via-fill through-hole(s).
17. The circuit image(s) is then plated, resist stripped, and etched to form the circuits including the copper cap(s) over the via-fill through-hole(s). (Process Flow step S15''')

In more detail, referring to FIGS. 16A, 16B, 18, 19A, 19B, 20A and 20B, an embodiment of the present invention provides a method of manufacturing a printed circuit board or a sub-component of the printed circuit board having a plurality of circuit layers with at least one hole for interconnecting copper patterns on the different circuit layers of the circuit board or the sub-component of the circuit board. The method includes: laminating the plurality of circuit layers with each other to form the circuit board or the sub-component of the circuit board with a first solid copper layer and a second solid copper layer respectively as both outermost layers of the circuit board or the sub-component of the circuit board; selectively removing a portion of the first solid copper layer and/or the second solid copper layer to form a clearance for drilling the hole; drilling the hole into the laminated circuit layers at the clearance; metalizing the circuit layers with the drilled hole to metalize the hole; coating a photo resist on both the outermost layers; patterning the photo resist on the circuit layers with a photo dot to expose the clearance and the metalized hole; electrolytic copper plating the metalized hole with the electrolytic plating solution to plate the metalized hole to a desired copper thickness in the metalized hole and with copper wrap continuously wrapping from the hole wall onto an outer surface in the clearance around the metalized hole; stripping the photo resist; filling the copper plated hole with a via fill material; curing the via fill material in the via filled hole; planarizing the via fill material and the plated copper wrap in the clearance around the plated hole to a level substantially the same as the level of the first solid copper layer and/or the second solid copper layer (or the level of the copper foil); and forming a conductive image to cover the planarized hole along with the planarized copper wrap. Here, the hole can be but not limited to, a drilled hole by mechanical drilling, a laser drilled hole, a combination of mechanical and laser drilled hole, or a water jet drilled hole.

Referring to FIGS. 19A and 20A, in one embodiment, the method includes metalizing the circuit layers with the clearance to metalize the clearance, prior to the drilling of the hole into the laminated circuit layers at the metalized clearance. The metalizing of the circuit layers with the clearance may include electroless copper plating the clearance by utilizing a smear removal process. Alternatively, the metalizing of the circuit layers with the clearance may include electroless copper plating the clearance without utilizing a smear removal process.

Referring now back to FIG. 16A, in one embodiment, the metalizing of the drilled circuit layers with the drilled hole to metalize the hole includes de-smearing the drilled hole, and electroless copper plating the de-smeared hole.

Referring to FIGS. 16A, 19A, and 20A, in one embodiment, a circumference of the clearance is bigger in size than that of the drilled hole. In one embodiment, a circumference of the photo dot is not less in size than that of the clearance. In one embodiment, a circumference of the clearance is bigger in size than that of the drilled hole, and a corresponding circumference of the photo dot for selective barrel plate is bigger in size than that of the clearance.

In one embodiment, the laminating of the plurality of circuit layers includes laminating a plurality of substrates with each other, each of the plurality of substrates being interposed between one and a corresponding one of the plurality of circuit layers, the plurality of substrates include a resin, and the removing of the portion of the first solid copper layer or the second solid copper layer (or the copper foil) to form the clearance includes selectively removing the portion of the first solid copper layer and/or the second solid copper layer (or the copper foil) down to the resin.

In one embodiment, the clearance is created only on one of the outermost layers. In an alternative embodiment, the clearance is created on both the outermost layers.

In one embodiment, the drilled hole is a through-hole. In an alternative embodiment, the drilled hole is drilled without going through the entire thickness of the circuit board or the sub-component of the circuit board.

In one embodiment, the patterning of the photo-resist includes dot imaging both the outmost layers. In an alternative embodiment, the patterning of the photo-resist includes dot imaging only one layer of the outmost layers and circuit imaging the other layer of the outmost layers.

In another embodiment of the present invention and referring to FIGS. 16A, 16B, 19A, 19B, 20A and 20B, in manufacturing Process Flow Step S2, S2', S2" copper will be selectively partial etched down without exposing resin at the base of the solid copper surface/copper foil and then follow the process flow shown above. That is, in one embodiment of the present invention, the laminating of the plurality of circuit layers includes laminating a plurality of substrates with each other, each of the plurality of substrates being interposed between one and a corresponding one of the plurality of circuit layers, the plurality of substrates include a resin, and the removing of the portion of the first solid copper layer and/or the second solid copper layer (or the copper foil) to form the clearance includes selectively removing the portion of the first solid copper layer and/or the second solid copper layer (or the copper foil) without exposing the resin.

In another embodiment of the present invention and referring to FIGS. 16A, 16B, 19A, 19B, 20A and 20B, in manufacturing Process Flow Step S2, S2', S2" copper will be selectively partial etched down after drilling the via filled holes first. In this case Process Flow Step S3 in FIG. 16A and Process Flow Step S4', S4" in FIGS. 19A and 20A will be skipped and rest of the process will be followed as normal. That is, in more detail, an embodiment of the present invention provides a method of manufacturing a printed circuit board or a sub-component of the printed circuit board having a plurality of circuit layers with at least one hole for interconnecting copper patterns on the different circuit layers of the circuit board or the sub-component of the circuit board. The method includes: laminating the plurality of circuit layers with each other to form the circuit board or the sub-component of the circuit board with a first solid copper layer and a second solid copper layer respectively as both outermost layers of the circuit board; drilling the hole into the laminated circuit layers; de-smearing the drilled hole; selectively removing a portion of the first copper layer and/or the second copper layer to form a clearance to correspond to the de-smeared hole; metalizing the circuit layers with the de-smeared hole and the corresponding clearance to metalize the de-smeared hole and the clearance around the hole; coating a photo resist on both the outermost layers; patterning the photo resist on the circuit layers with a photo dot to expose the metalized hole; electrolytic copper plating the metalized hole with the electrolytic plating solution to plate the metalized hole to a desired copper thickness in the metalized hole and with a copper wrap continuously wrapping from the hole wall onto an outer surface in the clearance around the metalized hole; stripping the photo resist; filling the copper plated hole with a via fill material; curing the via fill material in the via filled hole; planarizing the via fill material and the plated copper wraparound the plated hole in the clearance to a level substantially the same as the level of the first solid copper layer and/or the second solid copper layer (or the level of the copper foil); and forming a conductive image to cover the planarized hole with the planarized copper wrap. Here, the hole can be but not limited to, a drilled hole by mechanical drilling, a laser drilled hole, a combination of mechanical and laser drilled hole, or a water jet drilled hole.

In one embodiment, the metalizing of the drilled circuit layers includes electroless copper plating the clearance and the de-smeared hole.

In one embodiment, a circumference of the clearance is bigger in size than that of the drilled hole, and wherein a circumference of the photo dot is not smaller in size than that of the clearance.

Another embodiment of the present invention provides a method of manufacturing a printed circuit board or a sub-component of the printed circuit board having a plurality of circuit layers with at least one hole for interconnecting copper patterns on the different circuit layers of the circuit board or the sub-component of the circuit board. The method includes: laminating the plurality of circuit layers with each other to form the circuit board with a first solid copper layer and a second solid copper layer respectively as both outermost layers of the circuit board; etching the first solid copper layer and/or the second solid copper layer to form a clearance for drilling the at least one through-hole; drilling the at least one through-hole into the laminated circuit layers at the etched clearance; metalizing the drilled circuit layers with the drilled through-hole to metalize the at least one through-hole; coating a photo resist on both the outermost layers of the printed circuit board; patterning the photo resist on the circuit layers with a photo dot to expose the metalized through-hole on both the outermost layers of the printed circuit board; electrolytic copper plating the metalized through-hole with the electrolytic copper plating solution to plate the metalized through-hole to a desired copper thickness in the metalized through-hole and with a copper wrap wrapping on to the outer surface into the clearance around the metalized through-hole; stripping the photo resist; filling the copper plated through-hole with a via fill material; and curing the via fill material in the filled through-hole; planarizing the via fill material and the plated copper dot around the plated hole to a level substantially the same as the level of the first solid copper layer and/or the second solid copper layer (or the level of the copper foil); and forming a conductive cap to cover the planarized through-hole along with the planarized copper wrap. Here, the hole can be but not limited to, a drilled hole by mechanical drilling, a laser drilled hole, a combination of mechanical and laser drilled hole, or a water jet drilled hole.

In one embodiment, the metalizing of the drilled circuit layers with the through-hole drilled in etched clearance to metalize the at least one through-hole and etched clearance includes de-smearing the drilled through-hole and clearance, and electroless coppering the de-smeared through-hole and clearance.

In one embodiment, the method further includes metalizing of the circuit layers with the etched clearance to metalize the etched clearance using the smear removal process, prior to the drilling of the at least one through-hole into the laminated circuit layers at the metalized clearance. The metalizing of the circuit layers with the etched clearance may include electroless coppering the etched clearance without utilizing a smear removal process.

Here, the smear removal process can be but not limited to Permanganate, Plasma, Sulfuric acid, Chromic acid smear removal process. Also, in one embodiment, the smear removal process can be used more aggressively to create an etch-back condition. Further, the smear removal process can be replaced with mechanical micro-roughing the resin surface in etched clearance.

In one embodiment, the metalizing of the drilled circuit layers with the drilled through-hole to metalize the at least one through-hole includes de-smearing the drilled through-hole, and electroless coppering the de-smeared through-hole.

In one embodiment, a circumference of the etched clearance is bigger in size than a corresponding circumference of the drilled through-hole.

In one embodiment, a circumference of the photo dot is not less in size than a corresponding circumference of the etched clearance.

In one embodiment, a circumference of the etched clearance is bigger in size than a corresponding circumference of the drilled through-hole, and a corresponding circumference of the photo dot for selective barrel plate is bigger in size than the circumference of the etched clearance. The etched clearance can be any shape like round, square, etc.

In one embodiment, the laminating of the plurality of circuit layers includes laminating a plurality of substrates with each other, each of the plurality of substrates being interposed between one and a corresponding one of the plurality of circuit layers, wherein the plurality of substrates comprise a resin, and the etching of the first solid copper layer/copper foil and/or the second solid copper layer/copper foil to form the etched clearance includes selectively etching the first solid copper layer/copper foil and/or the second solid copper layer/copper foil down to the resin.

In one embodiment, the laminating of the plurality of circuit layers includes laminating a plurality of substrates with each other, each of the plurality of substrates being interposed between one and a corresponding one of the plurality of circuit layers, the plurality of substrates include a resin, and the etching of the first solid copper layer/copper foil and/or the second solid copper layer/copper foil to form the etched clearance includes selectively etching the first solid copper layer/copper foil and/or the second solid copper layer/copper foil without exposing the resin.

In one embodiment, the foil is removed by mechanical control depth milling, laser milling, etc.

In one embodiment, the Metalizing of the hole or clearance is done by utilizing direct metallization like Shadow Process (Electrochemicals, Inc.), Eclipse Process (MacDermid, Inc.), Dylex Process (Okuno Chemical Pvt. Ltd.), Copper or conductive metal deposition by sputtering or vacuum deposition process, etc.

In one embodiment, multiple holes are drilled in one clearance.

In one embodiment, the copper clearance is created only on one outer surface of the laminated structure.

In one embodiment, the drilled hole is a through-hole.

In one embodiment, the drilled hole is drilled without going through to the other side of the laminated structure.

In one embodiment, the drilled hole stops at an internal layer without penetrating that internal layer.

In one embodiment, the patterning is dot image on both outer surfaces.

In one embodiment, the patterning is dot image on one outer surface and circuit image on the other outer surface.

In one embodiment, the planarizing of the via fill material and the plated copper wrap comprises planarizing the via fill material and the plated copper wrap to be from about +0.0002" to about −0.0002" of the starting surface copper/copper foil thickness of a corresponding copper layer.

Another embodiment of the present invention provides a method of manufacturing a printed circuit board or a sub-component of the printed circuit board having a plurality of circuit layers with at least one hole for interconnecting copper patterns on the different circuit layers of the circuit board or the sub-component of the circuit board. The method includes: laminating the plurality of circuit layers with each other to form the circuit board with a first solid copper layer and a second solid copper layer respectively as both outermost layers of the circuit board; drilling the at least one through-hole into the laminated circuit layers; de-smearing the at least one through-hole; etching the first solid copper layer/copper foil and/or the second solid copper layer/copper foil to form an etched clearance to correspond to the at least one through-hole; metalizing the drilled circuit layers with the at least one through-hole to metalize the at least one through-hole; coating a photo resist on both the outermost layers of the printed circuit board; patterning the photo resist on the circuit layers with a photo dot to expose the metalized through-hole and the clearance on both the outermost layers of the printed circuit board; electrolytic copper plating the metalized through-hole with the electrolytic plating solution to plate the metalized through-hole to a desired copper thickness in the metalized through-hole and with a copper wrap wrapping on an outer surface into the clearance around the metalized through-hole; stripping the photo resist; filling the copper plated through-hole with a via fill material; curing the via fill material in the via filled through-hole; planarizing the via fill material and the plated copper wrap around the metalized hole in the etched clearance to a level substantially the same as the level of the first solid copper layer/copper foil and/or second solid copper layer/copper foil; and forming a conductive cap to cover the planarized through-hole with the planarized copper wrap.

In one embodiment, the metalizing of the drilled circuit layers includes electroless coppering the etched clearance and the at least one through-hole.

In one embodiment, a circumference of the etched clearance is bigger in size than a corresponding circumference of the drilled through-hole.

In one embodiment, a circumference of the photo dot is bigger in size than a corresponding circumference of the etched clearance.

In one embodiment, a circumference of the etched clearance is bigger in size than a corresponding circumference of the drilled through-hole, and a corresponding circumference of the photo dot is bigger in size than the circumference of the etched clearance.

In one embodiment, the laminating of the plurality of circuit layers includes laminating a plurality of substrates with each other, each of the plurality of substrates being interposed between one and a corresponding one of the plurality of circuit layers, the plurality of substrates comprise a resin, and the etching of the first solid copper layer/copper foil and/or second solid copper layer/copper foil to form the etched clearance includes selectively etching the first solid copper layer/copper foil and/or second solid copper layer/copper foil down to the resin.

In one embodiment, the laminating of the plurality of circuit layers includes laminating a plurality of substrates with each other, each of the plurality of substrates being interposed between one and a corresponding one of the plurality of circuit layers, the plurality of substrates include a resin, and the etching of the first solid copper layer/copper foil and/or second solid copper layer/copper foil to form the etched clearance includes selectively etching the first solid copper layer/copper foil and/or second solid copper layer/copper foil without exposing the resin.

In one embodiment, the planarizing of the via fill material and the plated copper wrap includes planarizing the via fill material and the plated copper wrap to be from about +0.0002" to about −0.0002" of the starting surface copper/copper foil thickness of a corresponding copper layer.

Another embodiment of the present invention provides a printed circuit board. The printed circuit board includes a plurality of circuit layers, a plurality of substrates, and at least one copper plated through-hole. Here, the plurality of circuit layers are laminated together to form the printed circuit board having a solid copper surface/copper foil on at least one side of the circuit board. Each of the plurality of substrates is interposed between one and a corresponding one of the plurality of circuit layers, and the at least one copper plated through-hole is in the plurality of circuit layers with a copper wrap for wrapping around the copper plated through-hole. Also, the at least one copper plated through-hole is filled with a via fill material, and the via filled through-hole with the copper wrap is planarized to a level substantially the same as a foil level of the copper foil.

In one embodiment, the printed circuit board further includes a conductive cap adapted to cover the at least one via filled through-hole with the copper wrap at the level substantially the same as the foil level of the copper foil.

In one embodiment, the level of the copper wrap is within a range from about +0.0002" to about −0.0002" of the starting surface copper thickness/copper foil thickness of a corresponding copper layer.

Figure 21A:
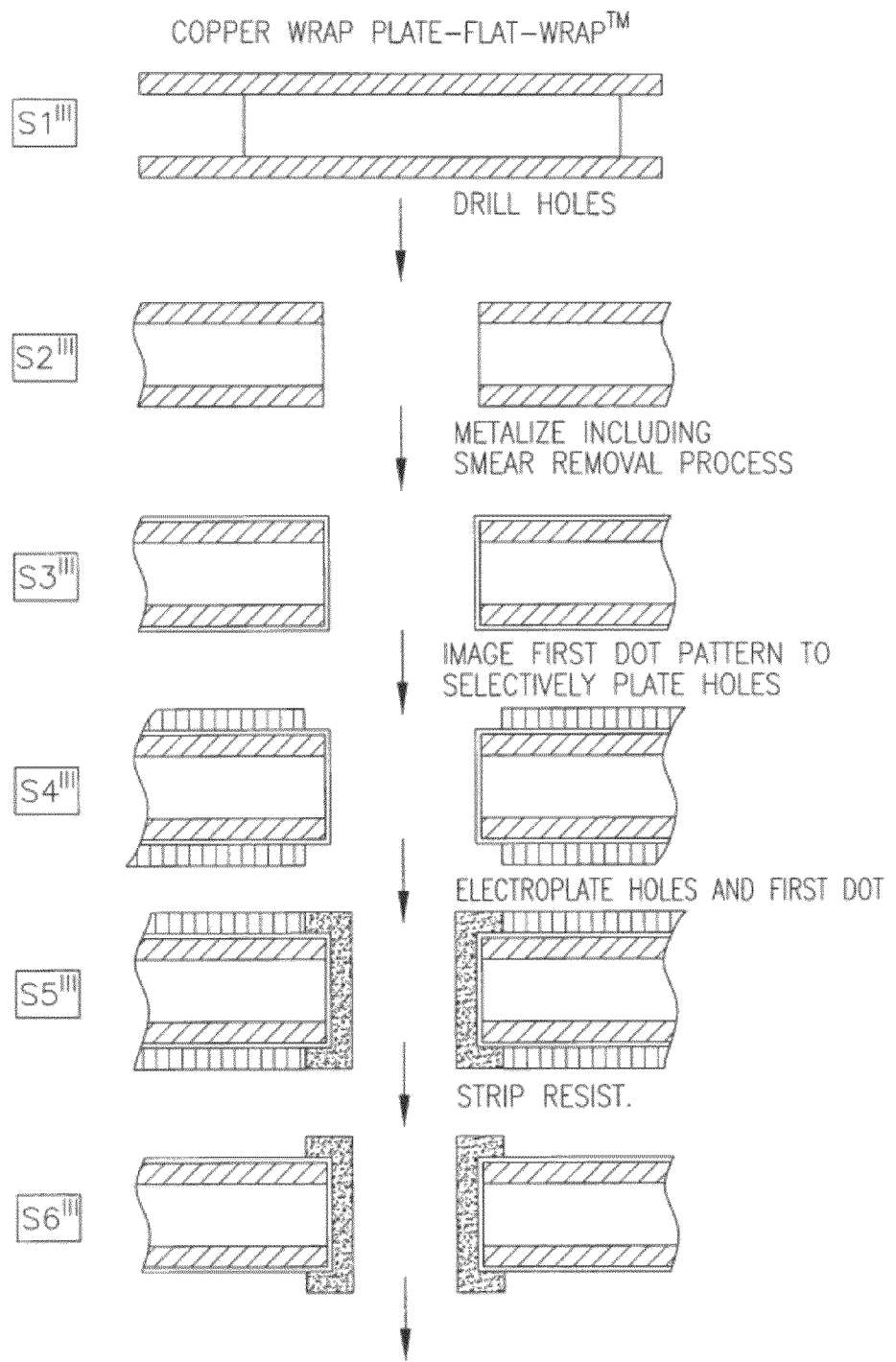
Figure 21B:
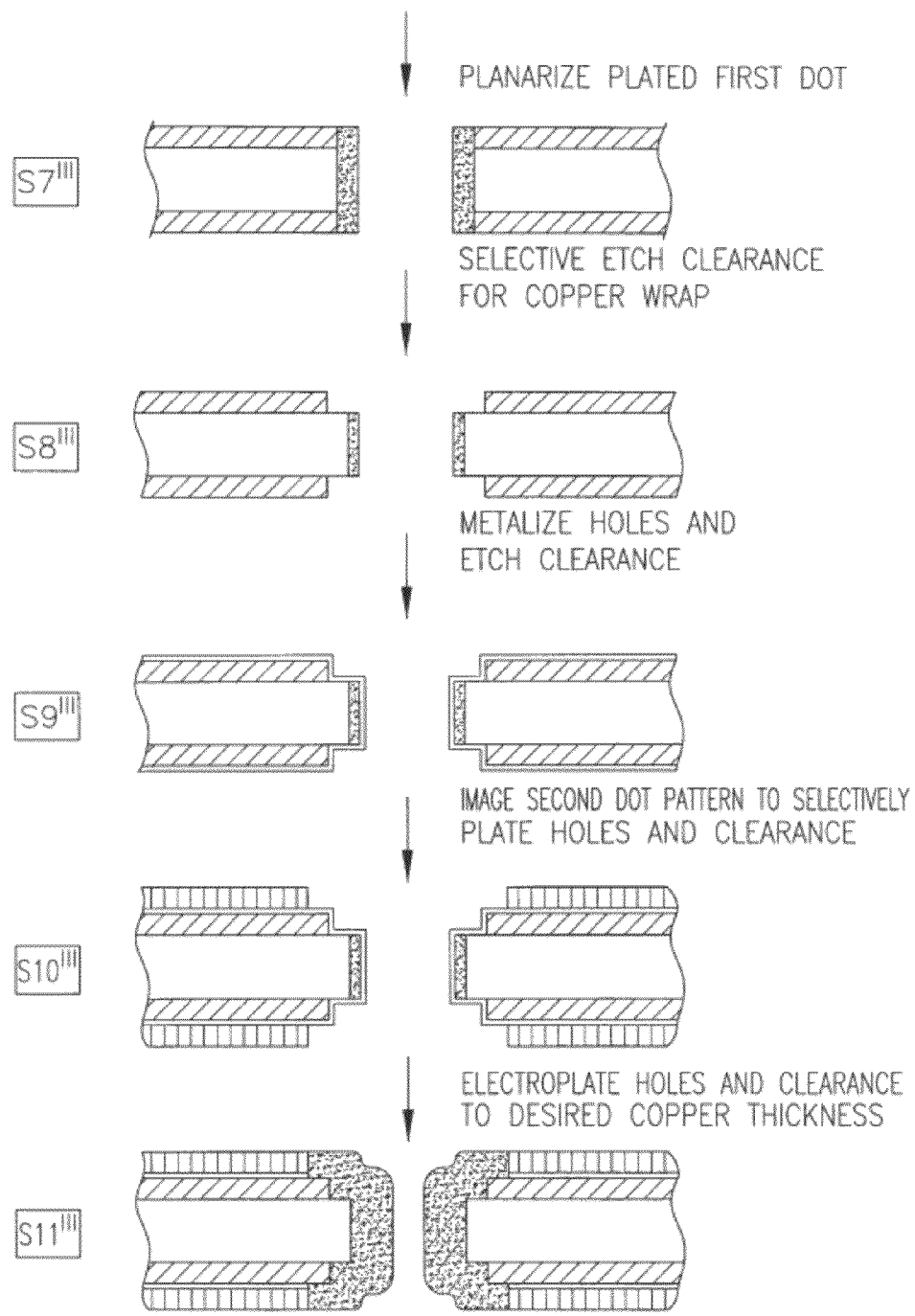
Figure 22:
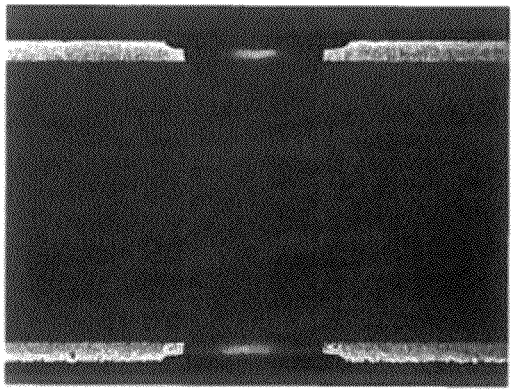
FIGS. 22, 23, 24, 25, 26 and 27 show a controlled etched copper process for FLAT-WRAP™ after drilling the via fill holes first.
Figure 23:
Figure 24:
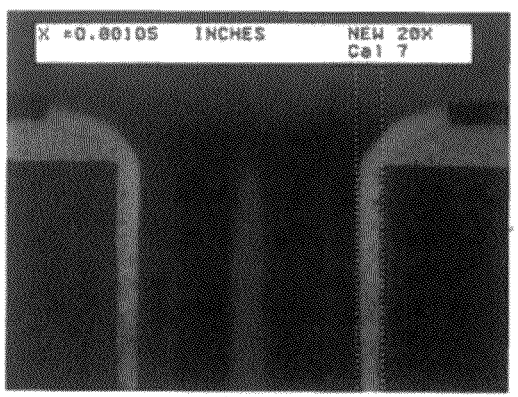
Figure 25:
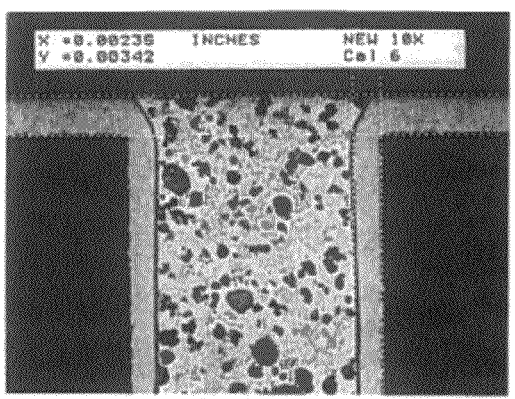
Figure 26:
Figure 27:
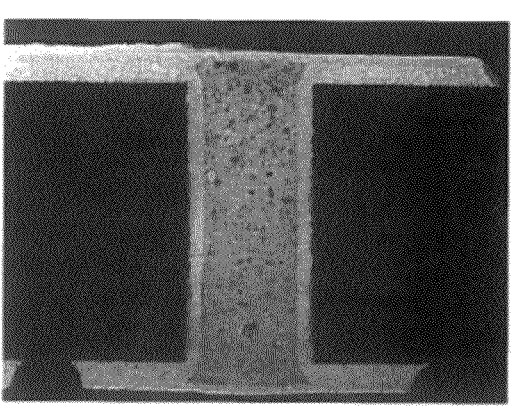

Referring to FIGS. 21A, 21B, and 21C, another embodiment of the present invention provides a method of manufacturing a printed circuit board or a sub-component of the printed circuit board having a plurality of circuit layers with at least one hole for interconnecting copper patterns on the different circuit layers of the circuit board or the sub-component of the circuit board. The method includes: laminating the plurality of circuit layers with each other to form the circuit board or the sub-component of the circuit board with a first solid copper layer and a second solid copper layer respectively as both outermost layers of the circuit board (Process Flow Step S1'''); drilling the hole into the laminated circuit layers (Process Flow Step S2'''); de-smearing the drilled hole and metalizing the circuit layers with the de-smeared hole to metalize the hole (Process Flow Step S3'''); coating a first photo resist on both the outermost layers and patterning the first photo resist on the circuit layers with a first photo dot to expose the metalized hole (Process Flow Step S4'''); electrolytic copper plating the metalized hole with a electrolytic plating solution to plate the metalized hole to a desired copper thickness (Process Flow Step S5'''); stripping the first photo resist (Process Flow Step S6'''); planarizing the plated first photo dot around the plated hole down to a level substantially the same as the level of the at least one of the first solid copper layer or the second solid copper layer (Process Flow Step S7); selectively removing a portion of at least one of the first solid copper layer and/or the second solid copper layer to form a clearance to correspond to the plated hole (Process Flow Step S8'''); metalizing the circuit layers with the plated hole and the clearance to metalize the clearance around the hole (Process Flow Step S9'''); coating a second photo resist on both the outermost layers and patterning the second photo resist on the circuit layers with a second photo dot to expose the metalized clearance and the hole (Process Flow Step S10'''); electrolytic copper plating the hole with the electrolytic plating solution to plate the hole to a desired copper thickness in the metalized hole and the copper wrap continuously wrapping from the hole wall onto an outer surface into the clearance around the hole (Process Flow Step S11'''); stripping the second photo resist (Process Flow Step S12'''); filling the copper plated hole with a via fill material and curing the via fill material in the filled hole (Process Flow Step S13'''); planarizing the via fill material and the plated copper dot around the plated hole and the clearance to a level substantially the same as the level of the at least one of the first solid copper layer or the second solid copper layer (Process Flow Step S14'''); and/or forming a conductive image to cover the planarized hole with the planarized copper wrap (Process Flow Step S15''').

In one embodiment, the metalizing the circuit layers with the de-smeared hole (Process Flow Step S3''') includes electroless copper plating the de-smeared hole, and the metalizing the circuit layers with the plated hole and the clearance includes electroless copper plating the clearance and the plated hole with or without using de-smear process (Process Flow Step S9''').

In one embodiment, a circumference of the clearance is bigger in size than that of the drilled hole, and a circumference of the second photo dot is not smaller in size than that of the clearance.

In one embodiment, the laminating of the plurality of circuit layers (Process Flow Step S1''') includes laminating a plurality of substrates with each other, each of the plurality of substrates being interposed between one and a corresponding one of the plurality of circuit layers, the plurality of substrates include a resin, and the removing of the portion of the first solid copper layer or the second solid copper layer (or the copper foil) to form the clearance (Process Flow Step S8''') includes selectively removing the portion of the first solid copper layer and/or the second solid copper layer (or the copper foil) down to the resin.

in one embodiment of the present invention, the laminating of the plurality of circuit layers (Process Flow Step S1''') includes laminating a plurality of substrates with each other, each of the plurality of substrates being interposed between one and a corresponding one of the plurality of circuit layers, the plurality of substrates include a resin, and the removing of the portion of the first solid copper layer and/or the second solid copper layer (or the copper foil) to form the clearance (Process Flow Step S8''') includes selectively removing the portion of the first solid copper layer and/or the second solid copper layer (or the copper foil) without exposing the resin.

FIGS. 22, 23, 24, 25, 26 and 27 show the controlled etched copper process for FLAT-WRAP™ after drilling the via fill holes first.

In view of the foregoing, embodiments of the present invention enhance the consistency of the wraparound plats of holes of printed circuit boards to provide extra reliability to the printed circuit boards and enable the designers and/or manufacturers of printed circuit boards to design and manufacture boards with relatively fine features and/or tight geometries.

While the invention has been described in connection with certain exemplary embodiments, it is to be understood by those skilled in the art that the invention is not limited to the disclosed embodiments, but, on the contrary, is intended to cover various modifications included within the spirit and scope of the present invention, and equivalents thereof.

What is claimed is:

1. A method of manufacturing a printed circuit board or a sub-component of the printed circuit board having a plurality of circuit layers with at least one hole for interconnecting copper patterns on the different circuit layers of the circuit board or the sub-component of the circuit board, the method comprising:
    laminating the plurality of circuit layers with each other to form the circuit board or the sub-component of the circuit board with a first solid copper layer and a second solid copper layer respectively as both outermost layers of the circuit board or the sub-component of the circuit board;
    selectively removing a portion of at least one of the first solid copper layer or the second solid copper layer to form a clearance for drilling the hole;
    drilling the hole into the laminated circuit layers at the clearance;
    metalizing the circuit layers with the drilled hole to metalize the hole;
    coating a photo resist on both the outermost layers;
    patterning the photo resist on the circuit layers with a photo dot to expose the clearance and the metalized hole;
    electrolytic copper plating the metalized hole with an electrolytic plating solution to plate the metalized hole to a desired copper thickness in the metalized hole and with copper wrap continuously wrapping from the hole wall onto an outer surface into the clearance around the metalized hole;
    stripping the photo resist;
    filling the copper plated hole with a via fill material;
    curing the via fill material in the via filled hole;
    planarizing the via fill material and the plated copper wrap in the clearance around the plated hole to a level substantially the same as the level of the at least one of the first solid copper layer or the second solid copper layer; and
    forming a conductive image to cover the planarized hole along with the planarized copper wrap.

2. The method of claim 1, further comprising:
    metalizing the circuit layers with the clearance to metalize the clearance, prior to the drilling of the hole into the laminated circuit layers at the metalized clearance.

3. The method of claim 2, wherein the metalizing of the circuit layers with the clearance comprises electroless copper plating the clearance by utilizing a smear removal process.

4. The method of claim 2, wherein the metalizing of the circuit layers with the clearance comprises electroless copper plating the clearance without utilizing a smear removal process.

5. The method of claim 1, wherein the metalizing of the drilled circuit layers with the drilled hole to metalize the hole comprises de-smearing the drilled hole, and electroless copper plating the de-smeared hole.

6. The method of claim 1, wherein a circumference of the clearance is bigger in size than that of the drilled hole.

7. The method of claim 1, wherein a circumference of the photo dot is not less in size than that of the clearance.

8. The method of claim 1, wherein a circumference of the clearance is bigger in size than that of the drilled hole, and wherein a corresponding circumference of the photo dot for selective barrel plate is bigger in size than that of the clearance.

9. The method of claim 1, wherein the laminating of the plurality of circuit layers comprises laminating a plurality of substrates with each other, each of the plurality of substrates being interposed between one and a corresponding one of the plurality of circuit layers, wherein the plurality of substrates comprise a resin, and wherein the removing of the portion of the at least one of the first solid copper layer or the second solid copper layer to form the clearance comprises selectively removing the portion of the at least one of the first solid copper layer or the second solid copper layer down to the resin.

10. The method of claim 1, wherein the laminating of the plurality of circuit layers comprises laminating a plurality of substrates with each other, each of the plurality of substrates being interposed between one and a corresponding one of the plurality of circuit layers, wherein the plurality of substrates comprise a resin, and wherein the removing of the portion of the at least one of the first solid copper layer or the second solid copper layer to form the clearance comprises selectively removing the portion of the at least one of the first solid copper layer or the second solid copper layer without exposing the resin.

11. The method of claim 1, wherein the clearance is created only on one of the outermost layers.

12. The method of claim 1, wherein the clearance is created on both the outermost layers.

13. The method of claim 1, wherein the drilled hole is a through-hole.

14. The method of claim 1, wherein the drilled hole is drilled without going through the entire thickness of the circuit board or the sub-component of the circuit board.

15. The method of claim 1, wherein the patterning of the photo-resist comprises dot imaging both the outmost layers.

16. The method of claim 1, wherein the patterning of the photo-resist comprises dot imaging only one layer of the outmost layers and circuit imaging the other layer of the outmost layers.

17. A method of manufacturing a printed circuit board or a sub-component of the printed circuit board having a plurality of circuit layers with at least one hole for interconnecting copper patterns on the different circuit layers of the circuit board or the sub-component of the circuit board, the method comprising:
    laminating the plurality of circuit layers with each other to form the circuit board or the sub-component of the circuit board with a first solid copper layer and a second solid copper layer respectively as both outermost layers of the circuit board;
    drilling the hole into the laminated circuit layers;
    de-smearing the drilled hole;
    selectively removing a portion of at least one of the first solid copper layer or the second solid copper layer to form a clearance to correspond to the de-smeared hole;
    metalizing the circuit layers with the de-smeared hole and the corresponding clearance to metalize the de-smeared hole;
    coating a photo resist on both the outermost layers;
    patterning the photo resist on the circuit layers with a photo dot to expose the metalized hole;
    electrolytic copper plating the metalized hole with an electrolytic plating solution to plate the metalized hole to a desired copper thickness in the metalized hole and with a copper wrap continuously wrapping from the hole wall onto an outer surface in the clearance around the metalized hole;
    stripping the photo resist;
    filling the copper plated hole with a via fill material;

curing the via fill material in the via filled hole;

planarizing the via fill material and the plated copper wrap in the clearance around the plated hole to a level substantially the same as the level of the at least one of the first solid copper layer or the second solid copper layer; and forming a conductive image to cover the planarized hole with the planarized copper wrap.

18. The method of claim 17, wherein the metalizing of the drilled circuit layers comprises electroless copper plating the clearance and the de-smeared hole.

19. The method of claim 17, wherein a circumference of the clearance is bigger in size than that of the drilled hole, and wherein a circumference of the photo dot is not smaller in size than that of the clearance.

20. The method of claim 17, wherein the laminating of the plurality of circuit layers comprises laminating a plurality of substrates with each other, each of the plurality of substrates being interposed between one and a corresponding one of the plurality of circuit layers, wherein the plurality of substrates comprise a resin, and wherein the removing of the portion of the at least one of the first solid copper layer or the second solid copper layer to form the clearance comprises selectively etching the portion of the at least one of the first solid copper layer or the second solid copper layer down to the resin.

21. The method of claim 17, wherein the laminating of the plurality of circuit layers comprises laminating a plurality of substrates with each other, each of the plurality of substrates being interposed between one and a corresponding one of the plurality of circuit layers, wherein the plurality of substrates comprise a resin, and wherein the removing of the portion of the at least one of the first solid copper layer or the second solid copper layer to form the clearance comprises selectively etching the portion of the at least one of the first solid copper layer or the second solid copper layer without exposing the resin.

* * * * *